(12) United States Patent
Mo et al.

(10) Patent No.: US 11,963,368 B2
(45) Date of Patent: Apr. 16, 2024

(54) RESISTIVE RANDOM ACCESS MEMORY DEVICE

(71) Applicant: Taiwan Semiconductor Manufacturing Co., Ltd., Hsin-Chu (TW)

(72) Inventors: Chun-Chieh Mo, Kaohsiung (TW); Shih-Chi Kuo, Yangmei (TW); Tsai-Hao Hung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 35 days.

(21) Appl. No.: 17/330,295

(22) Filed: May 25, 2021

(65) Prior Publication Data

US 2021/0280636 A1 Sep. 9, 2021

Related U.S. Application Data

(60) Continuation of application No. 16/843,635, filed on Apr. 8, 2020, now Pat. No. 11,024,671, which is a
(Continued)

(51) Int. Cl.
| | |
|---|---|
| H10B 63/00 | (2023.01) |
| H10B 61/00 | (2023.01) |
| H10N 50/01 | (2023.01) |
| H10N 50/10 | (2023.01) |
| H10N 50/80 | (2023.01) |
| H10N 50/85 | (2023.01) |
| H10N 70/00 | (2023.01) |
| H10N 70/20 | (2023.01) |

(52) U.S. Cl.
CPC ............ *H10B 63/24* (2023.02); *H10B 61/10* (2023.02); *H10B 63/80* (2023.02); *H10N 50/01* (2023.02); *H10N 50/10* (2023.02); *H10N 50/80* (2023.02); *H10N 70/021* (2023.02); *H10N 70/063* (2023.02); *H10N 70/231* (2023.02); *H10N 70/24* (2023.02); *H10N 70/245* (2023.02); *H10N 70/826* (2023.02); *H10N 70/841* (2023.02); *H10N 50/85* (2023.02); *H10N 70/8825* (2023.02); *H10N 70/8833* (2023.02); *H10N 70/8845* (2023.02)

(58) Field of Classification Search
CPC ............ H01L 45/1253; H01L 27/2436; H01L 45/1608; H01L 45/1666; H01L 27/24–249
See application file for complete search history.

(56) References Cited

U.S. PATENT DOCUMENTS

| 10,211,397 B1 * | 2/2019 | Jo | ........................ H10N 70/245 |
| 2010/0135068 A1 | 6/2010 | Ikarashi | |

(Continued)

*Primary Examiner* — Brian Turner
(74) *Attorney, Agent, or Firm* — Duane Morris LLP

(57) ABSTRACT

A memory includes: a dielectric fin formed over a substrate; and a pair of memory cells disposed along respective sidewalls of the dielectric fin, each of the pair of memory cells comprising: a first conductor layer; a selector layer; a resistive material layer; and a second conductor layer, wherein the first conductor layer, selector layer, resistive material layer, and second conductor layer each includes upper and lower boundaries, and at least one of the upper and lower boundaries is tilted away from one of the sidewalls of the dielectric fin by an angle.

20 Claims, 18 Drawing Sheets

Related U.S. Application Data division of application No. 16/116,308, filed on Aug. 29, 2018, now Pat. No. 10,651,237.

(56) References Cited

U.S. PATENT DOCUMENTS

| | | |
|---|---|---|
| 2014/0183435 A1* | 7/2014 | Kim .................... H01L 27/2463 257/4 |
| 2015/0243708 A1 | 8/2015 | Ravasio |
| 2015/0243885 A1 | 8/2015 | Sciarello |
| 2015/0372056 A1 | 12/2015 | Seong |
| 2017/0236869 A1 | 8/2017 | Tran |
| 2018/0375023 A1 | 12/2018 | Song |
| 2020/0013463 A1* | 1/2020 | Redaelli ............... H10N 70/882 |

* cited by examiner

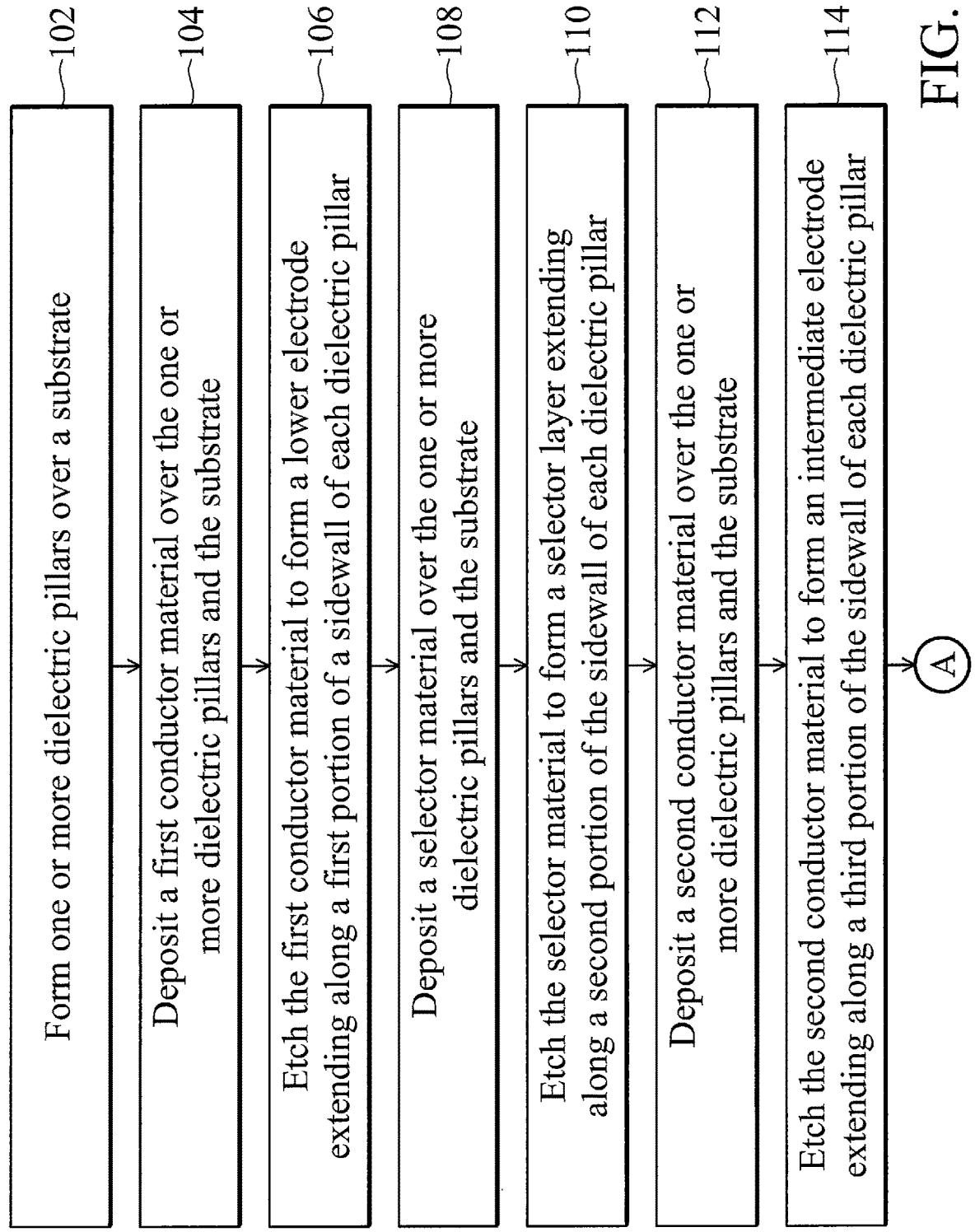

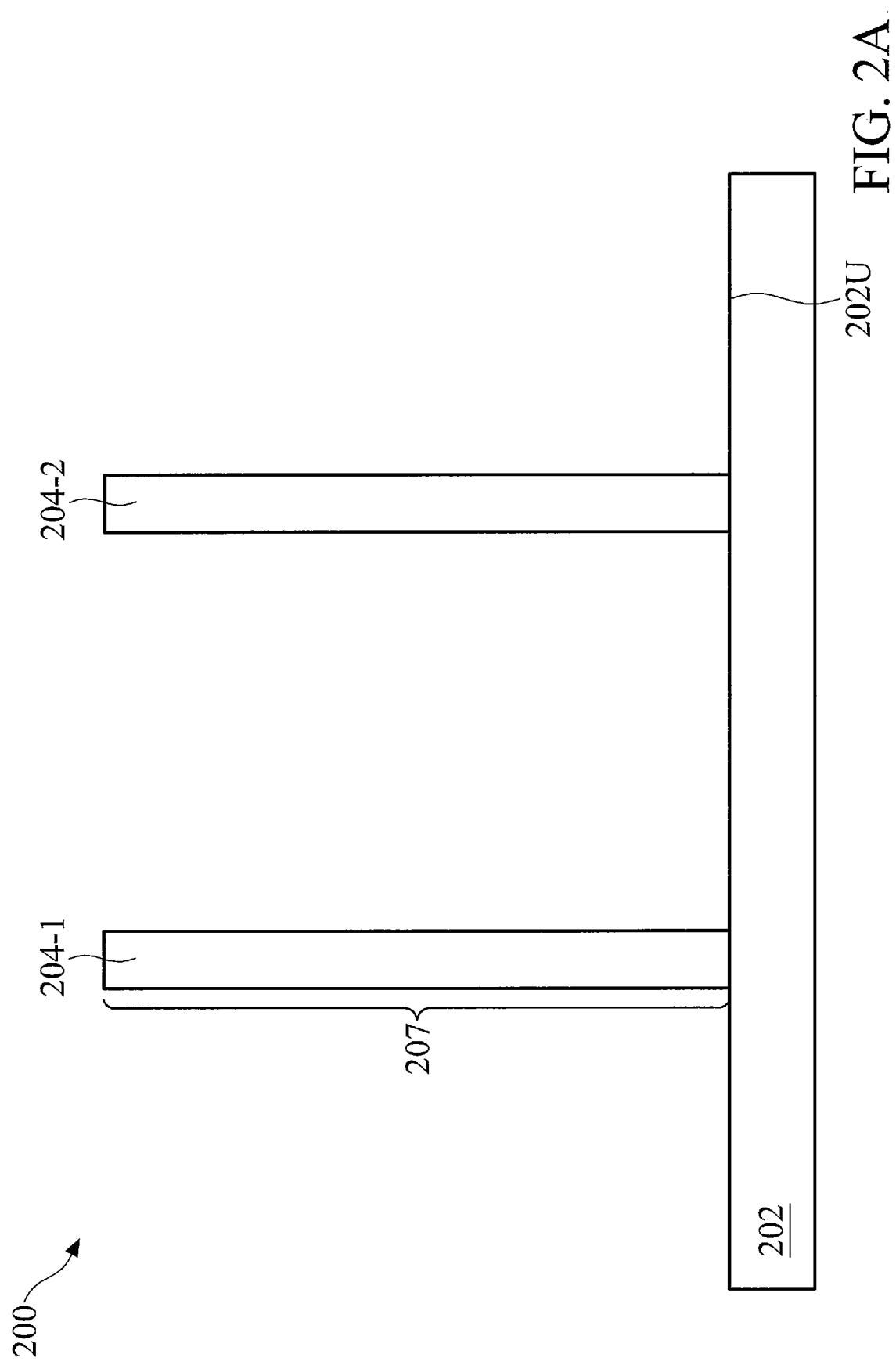

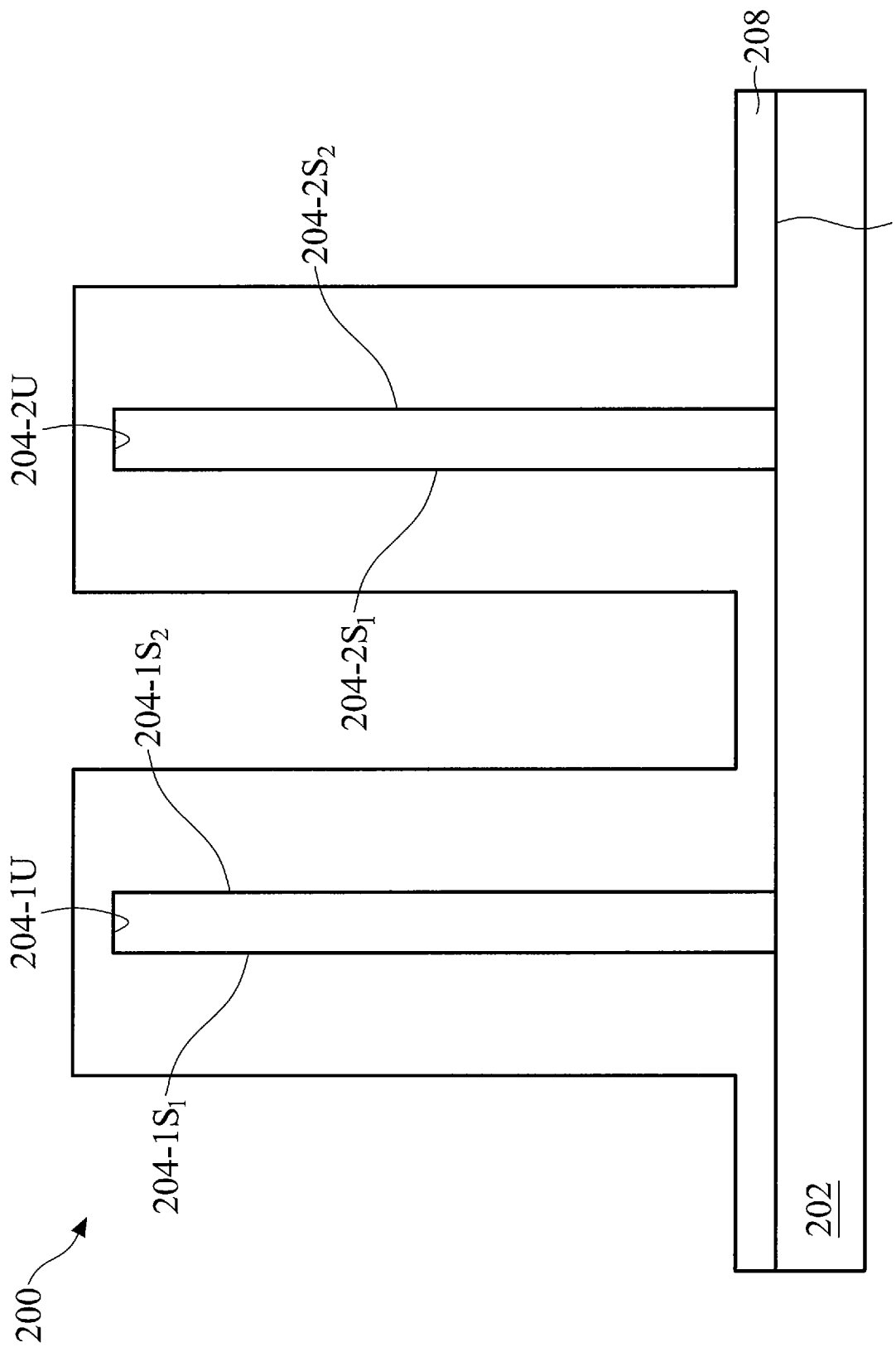

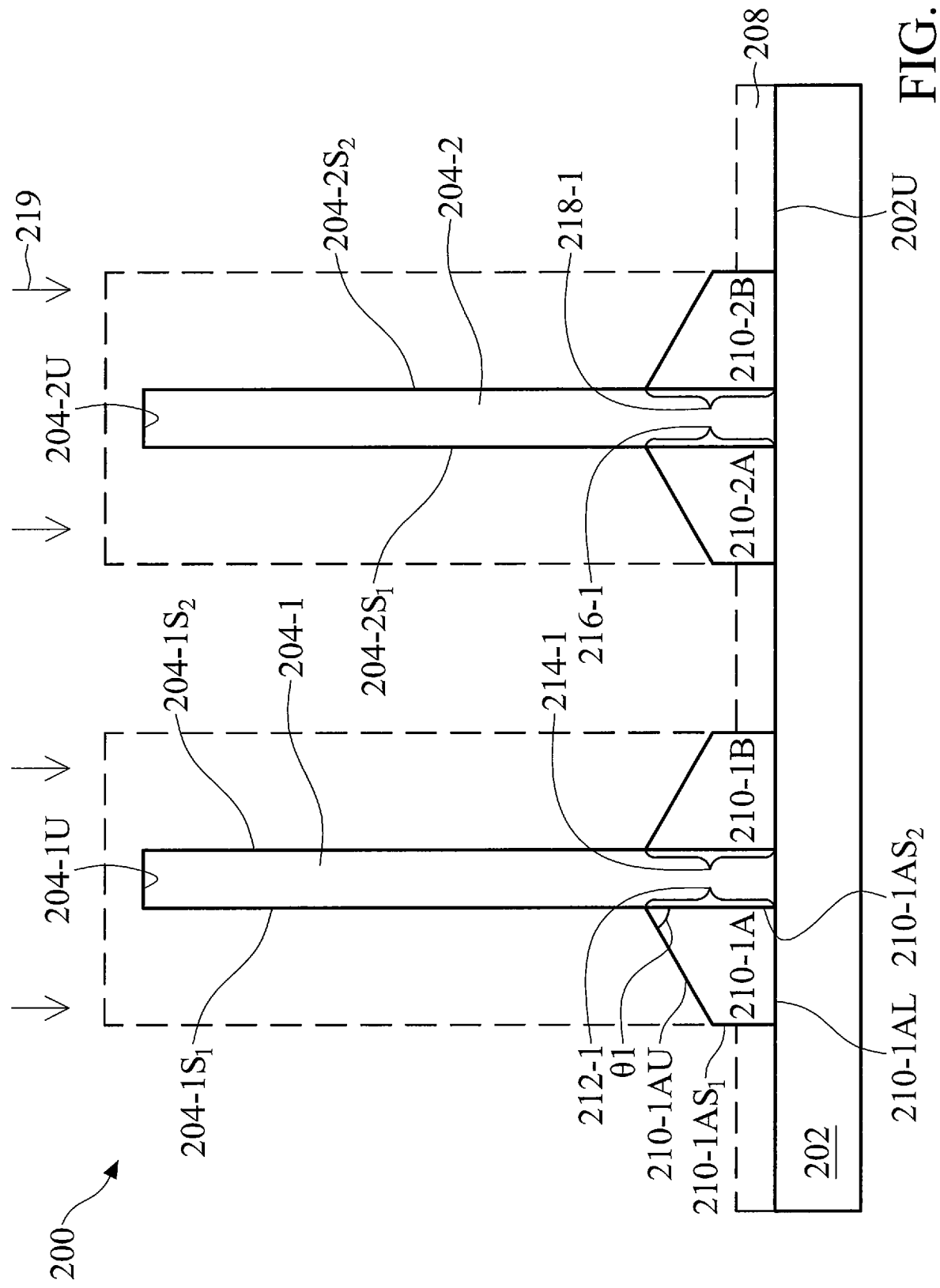

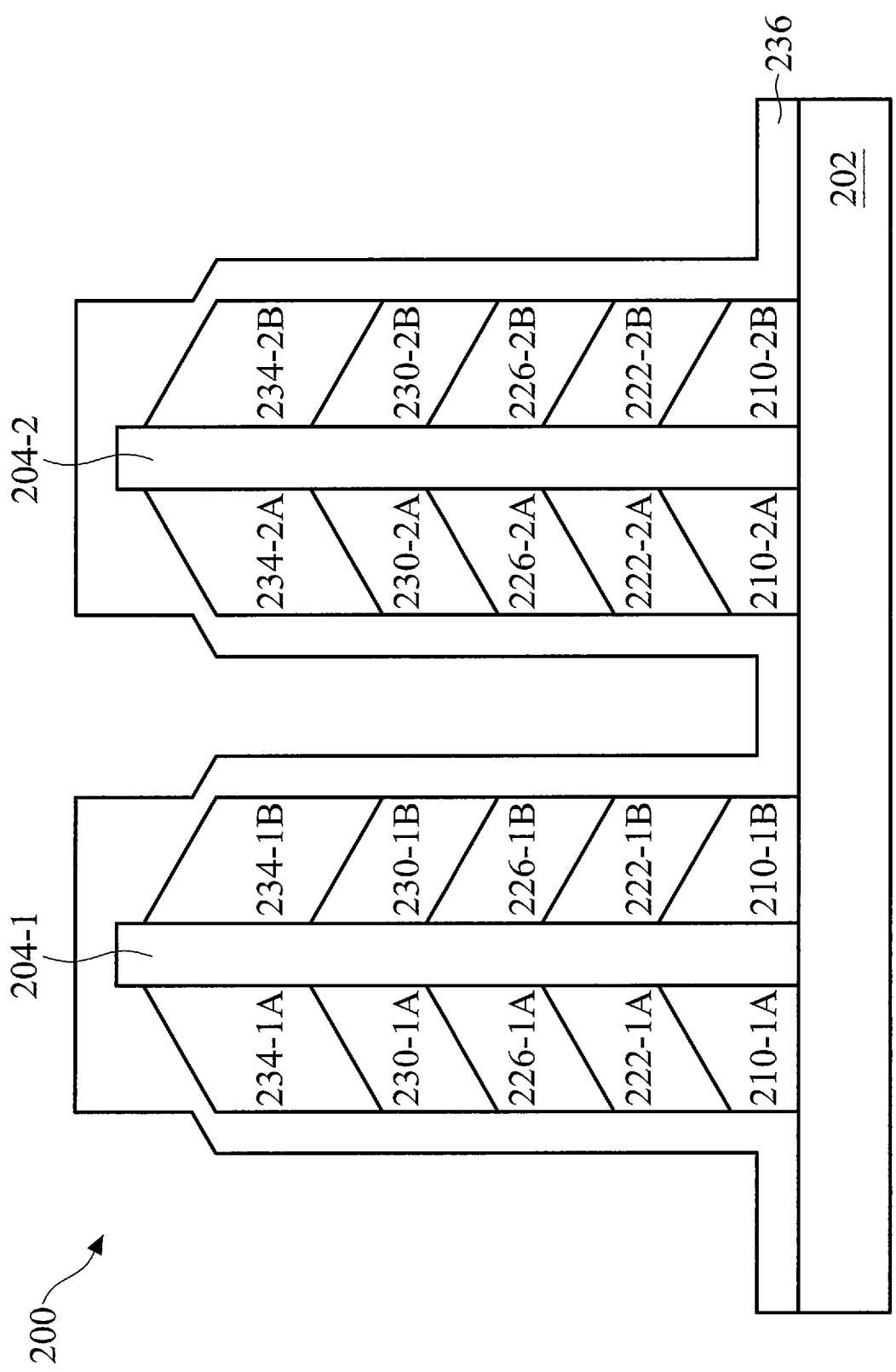

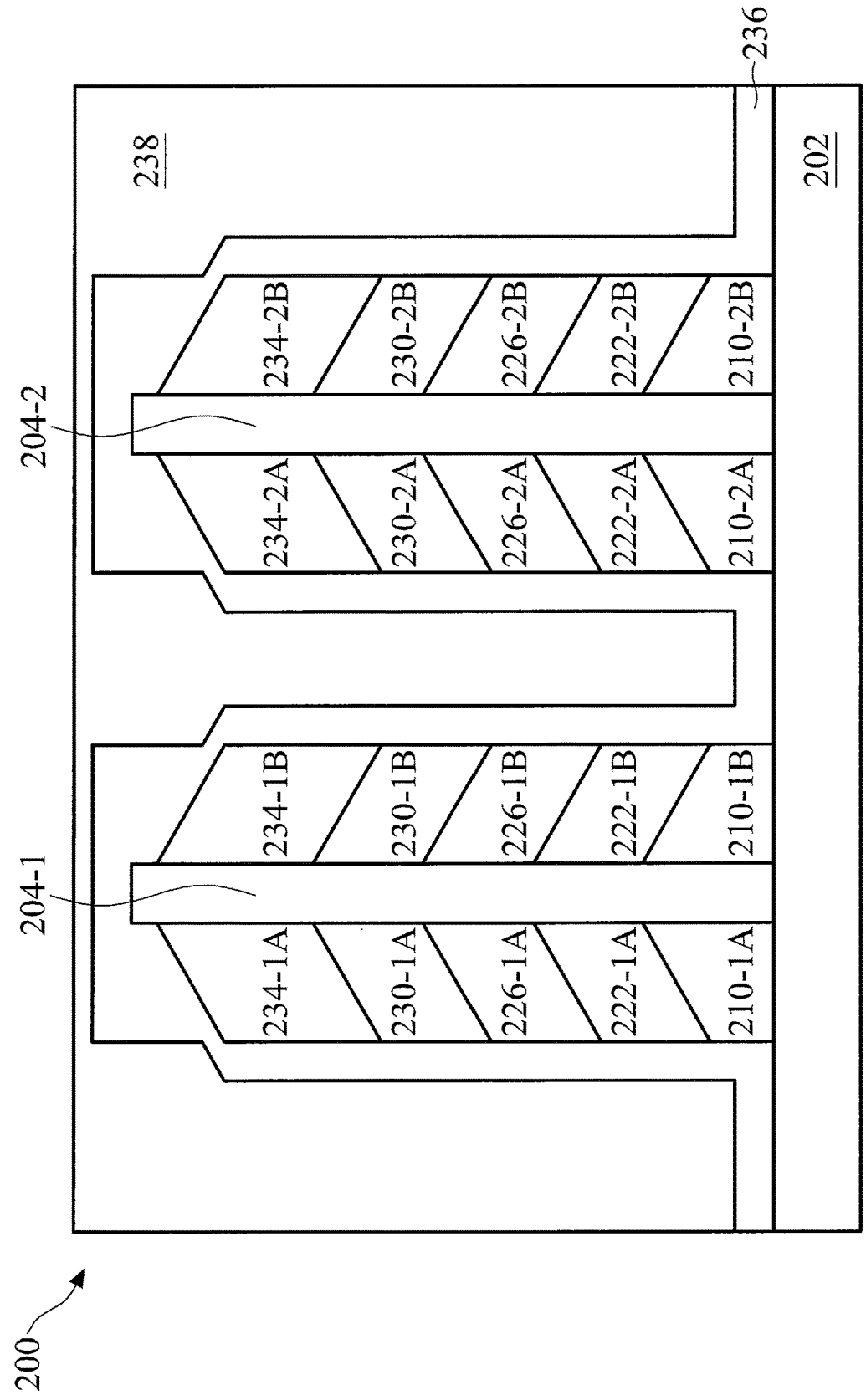

RESISTIVE RANDOM ACCESS MEMORY DEVICE

CROSS-REFERENCE TO RELATED APPLICATIONS

This application is a continuation application of U.S. patent application Ser. No. 16/843,635, filed Apr. 8, 2020, which is a divisional application of U.S. patent application Ser. No. 16/116,308, filed on Aug. 29, 2018, the contents of which are incorporated herein by reference in its entirety.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state (HRS) and a low resistance state (LRS), have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

In general, an RRAM device includes a lower electrode (e.g., an anode) and an upper electrode (e.g., a cathode) with a variable resistive material layer interposed therebetween. The existing RRAM device is typically formed by sequentially depositing plural layers to form the lower electrode, the variable resistive material layer, and the upper electrode, and then etching the plural layers all together, such that the respective lower and upper boundaries of the lower electrode, variable resistive material layer, and the upper electrode of the existing RRAM device are horizontally aligned with one another. Such a method to farm an RRAM array that includes a plurality of arranged RRAM devices is typically subjected to the limit of a lithography technique used to define the pitch of each RRAM device of the RRAM array. Further, there exists multiple conductive pathways resulting in a difficult evaluation of device performances.

Thus, existing RRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 1A, 1B, and 1C illustrate a flow chart of an exemplary method for forming a semiconductor device, in accordance with some embodiments.

FIG. 2A, 2B, 2C, 2D, 2E, 2F, 2G, 2H, 2I, 2J, 2K, 2L, 2M, and 2N illustrate cross-sectional views of an exemplary semiconductor device during various fabrication stages, made by the method of FIG. 1, in accordance with some embodiments.

DETAILED DESCRIPTION OF EXEMPLARY EMBODIMENTS

Figure 1B:
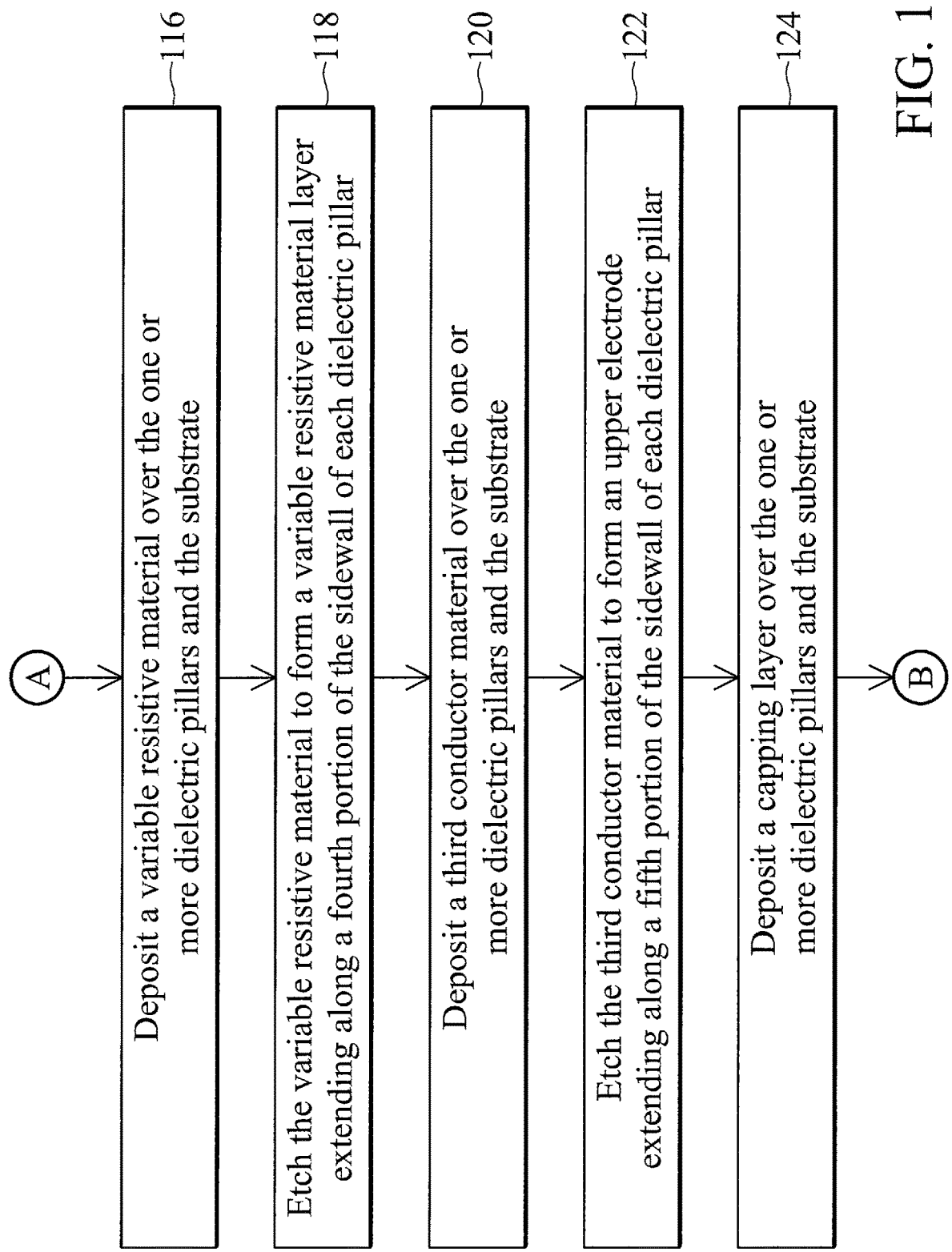

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel resistive random access memory (RRAM) device and methods to form the same. In some embodiments, the disclosed RRAM device includes one or more RRAM cells that each extends along the sidewall of a respective dielectric fin. Each of the one or more RRAM cells is formed of an RRAM resistor and an RRAM selector that are sandwiched between a lower electrode and an upper electrode, wherein the RRAM resistor is formed by either the lower or upper electrode, an intermediate electrode, and a variable resistive material layer, and the RRAM selector is formed by either the upper or lower electrode, the intermediate electrode, and a selector layer. In some embodiments, an upper boundary of the lower electrode, respective lower and upper boundaries of the selector layer, intermediate electrode, variable resistive material layer, and a lower boundary of the upper electrode are each tilted away from the sidewall of the extended dielectric fin by an acute angle. As such, when viewed cross-sectionally, at least the selector layer and variable resistive material layer can each present a rhomboid-based or rhombus-based profile, which may provide a directional conduction path (i.e., shortest distance) crossing each of the selector layer and variable resistive material layer and enable an accurate evaluation of device performances.

Figure 1C:
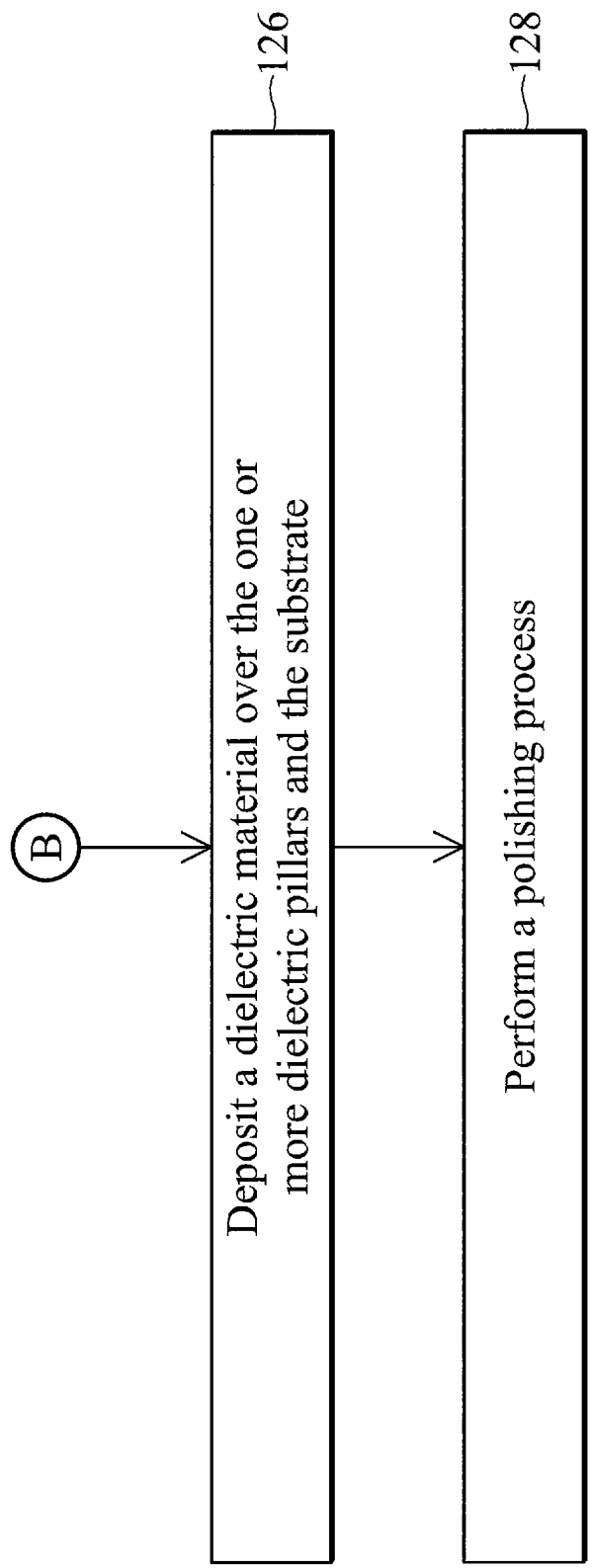

FIGS. 1A, 1B, 1C collectively illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is noted that the method 100 of FIGS. 1A-1C does not produce a completed RRAM device. A completed RRAM device may be fabricated using complementary metal-oxide-semiconductor (CMOS) technology processing. Accordingly, it is understood that additional operations may be provided before, during, and after the method 100 of FIGS. 1A-1C, and that some other operations may only be briefly described herein. In some other embodiments, the method may be used to form any of a variety of nonvolatile memory (NVM) devices, such as ferroelectric random access memory (FRAM) devices, phase-change random access memory (PRAM) devices, magnetoresistive random access memory (MRAM) devices, conductive bridge random access memory (CBRAM) devices, etc., while remaining within the scope of the present disclosure.

Referring first to FIG. 1A, in some embodiments, the method 100 starts with operation 102 in which one or more dielectric fins are fowled over a substrate. The method 100 continues to operation 104 in which a first conductor material is deposited over the one or more dielectric fins and the substrate. The method 100 continues to operation 106 in which the first conductor material is etched to form a lower electrode extending along a first portion of a sidewall of each dielectric fin. In some embodiments, an anisotropic etching process is performed on the first conductor material, which conformally overlays an upper boundary of the substrate, an upper boundary of each dielectric fin, and the sidewall of each dielectric fin, to form the lower electrode. As such, an upper boundary of the lower electrode may be tiled away from the first portion of the sidewall of the respective dielectric fin by an acute angel while a lower boundary of the lower electrode is aligned with (e.g., in contact with) the upper boundary of the substrate. Further, a first sidewall of the lower electrode may be in contact with the first portion of the sidewall of the respective dielectric fin and a second sidewall of the lower electrode may be substantially parallel to the first portion of the sidewall of the respective dielectric fin.

The method 100 continues to operation 108 in which a selector material is deposited over the one or more dielectric fins and the substrate. The method 100 continues to operation 110 in which the selector material is etched to form a selector layer extending along a second portion of the sidewall of each dielectric fin. In some embodiments, an anisotropic etching process is performed on the selector material, which conformally overlays a re-exposed portion of the upper boundary of the substrate, the upper boundary of each dielectric fin, a re-exposed portion of the sidewall of each dielectric fin, and the lower electrode, to form the selector layer. As such, an upper boundary of the selector layer may be tiled away from the second portion of the sidewall of the respective dielectric fin by an acute angel while a lower boundary of the selector layer is aligned with (e.g., in contact with) the upper boundary of the lower electrode. Further, a first sidewall the selector layer may be in contact with the second portion of the sidewall of the respective dielectric fin and a second sidewall of the selector layer may be vertically aligned with the second sidewall of the lower electrode.

The method 100 continues to operation 112 in which a second conductor material is deposited over the one or more dielectric fins and the substrate. The method 100 continues to operation 114 in which the second conductor material is etched to form an intermediate electrode extending along a third portion of the sidewall of each dielectric fin. In some embodiments, an anisotropic etching process is performed on the second conductor material, which conformally overlays the re-exposed portion of the upper boundary of the substrate, the upper boundary of each dielectric fin, a re-exposed portion of the sidewall of each dielectric fin, and the selector layer, to form the intermediate electrode. As such, an upper boundary of the intermediate electrode may be tiled away from the third portion of the sidewall of the respective dielectric fin by an acute angel while a lower boundary of the intermediate electrode is aligned with (e.g., in contact with) the upper boundary of the selector layer. Further, a first sidewall the intermediate electrode may be in contact with the third portion of the sidewall of the respective dielectric fin and a second sidewall the intermediate electrode may be vertically aligned with the second sidewall of the lower electrode and the second sidewall of the selector layer, respectively.

Referring to FIG. 1B, the method 100 continues to operation 116 in which a variable resistive material is deposited over the one or more dielectric fins and the substrate. The method 100 continues to operation 118 in which the variable resistive material is etched to form a variable resistive material layer extending along a fourth portion of the sidewall of each dielectric fin. In some embodiments, an anisotropic etching process is performed on the variable resistive material, which conformally overlays the re-exposed portion of the upper boundary of the substrate, the upper boundary of each dielectric fin, a re-exposed portion of the sidewall of each dielectric fin, and the intermediate electrode, to form the variable resistive material layer. As such, an upper boundary of the variable resistive material layer may be tiled away from the fourth portion of the sidewall of the respective dielectric fin by an acute angel while a lower boundary of the variable resistive material layer is aligned with (e.g. in contact with) the upper boundary of the intermediate electrode. Further, a first sidewall of the variable resistive material layer may be in contact with the fourth portion of the sidewall of the respective dielectric fin and a second sidewall of the variable resistive material layer may be vertically aligned with the second sidewall of the lower electrode, the second sidewall of the selector layer, and the second sidewall of the intermediate electrode, respectively.

The method 100 continues to operation 120 in which a third conductor material is deposited over the one or more dielectric fins and the substrate. The method 100 continues to operation 122 in which the third conductor material is etched to form an upper electrode extending along a fifth portion of the sidewall of each dielectric fin. In some embodiments, an anisotropic etching process is performed on the third conductor material, which conformally overlays the re-exposed portion of the upper boundary of the substrate, the upper boundary of each dielectric fin, a re-exposed portion of the sidewall of each dielectric fin, and the variable resistive material layer, to form the upper electrode. As such, an upper boundary of the upper electrode may be tiled away from the fifth portion of the sidewall of the respective dielectric fin by an acute angel while a lower boundary of the lower electrode is aligned with (e.g., in contact with) the upper boundary of the variable resistive material layer. Further, a first sidewall of the upper electrode may be in contact with the fifth portion of the sidewall of the respective dielectric fin and a second sidewall of the upper electrode may be vertically aligned with the second sidewall of the lower electrode, the second sidewall of the selector layer, the second sidewall of the intermediate electrode, and the second sidewall of the variable resistive material layer, respectively.

The method 100 continues to operation 124 in which a capping layer is deposited over the one or more dielectric fins and the substrate. In some embodiments, the capping layer may be formed to overlay the re-exposed portion of the upper boundary of the substrate, the upper boundary of each dielectric fin, a re-exposed portion of the sidewall of each dielectric fin, and the respective second sidewalls of the lower electrode, the selector layer, the intermediate electrode, the variable resistive material layer, and the upper electrode. In some embodiments, a patterning process can be performed to first cover portions of the sidewalls of each dielectric fin and the corresponding sidewalls of the lower electrode so as to form a capping layer only on one sidewall of the fin.

Referring then to FIG. 1C, the method 100 continues to operation 126 in which a dielectric material is deposited over the one or more dielectric fins and the substrate. In some embodiments, the dielectric material is formed to fill gaps between the dielectric fins. More specifically, the dielectric material fills at least the gaps between the respective lower electrodes, selector layers, intermediate electrodes, variable resistive material layers, and upper electrodes extending along two adjacent dielectric fins. The method 100 continues to operation 128 in which a polishing process is performed. In some embodiments, the polishing process (e.g., a chemical mechanical polishing (CMP) process) may be performed on the dielectric material, portions of the one or more dielectric fins, and portions of the upper electrodes until the respective upper electrodes extending along the one or more dielectric fins share a coplanar upper boundary.

Figure 2D:
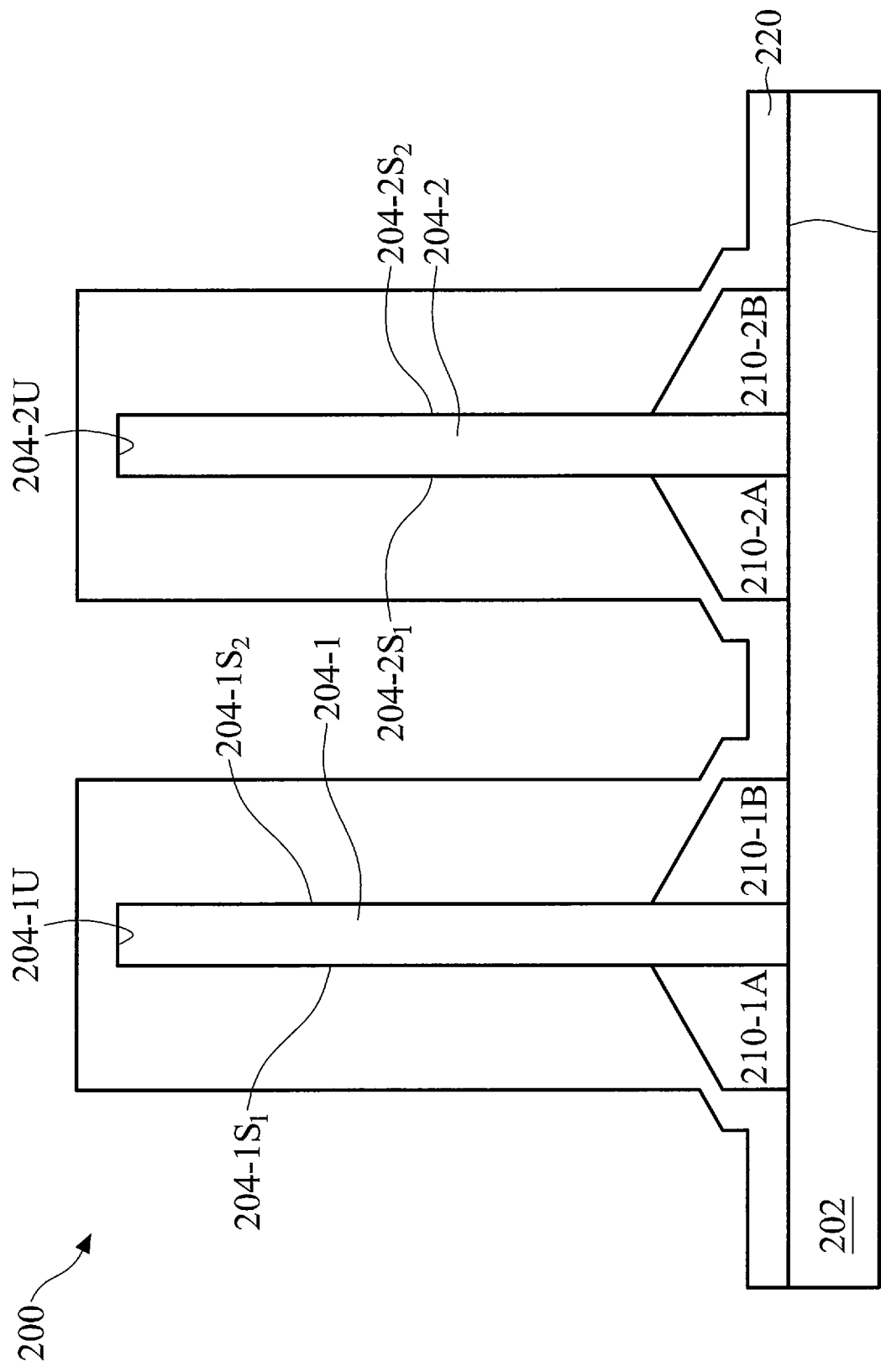

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, 2K, 2L, 2M, and 2N, respectively. In some embodiments, the semiconductor device 200 may be an RRAM device. The RRAM device 200 may be included in a microprocessor, memory cell, and/or other integrated circuit (IC). Also, FIGS. 2A through 2N are simplified for a better understanding of the concepts of the present disclosure. For example, although the figures illustrate the RRAM device 200, it is understood the IC, in which the RRAM device 200 is formed, may include a number of other devices comprising resistors, capacitors, inductors, fuses, etc., which are not shown in FIGS. 2A through 2N, for purposes of clarity of illustration.

Corresponding to operation 102 of FIG. 1A, FIG. 2A is a cross-sectional view of the RRAM device 200 including a substrate 202 with a plurality of fins 204-1 and 204-2, which is provided at one of the various stages of fabrication, according to some embodiments. Although the RRAM device 200 in the illustrated embodiment of FIG. 2A includes two fins 204-1 and 204-2, it is understood that the illustrated embodiment of FIG. 2A and the following figures are merely provided for illustration purposes. Thus, the RRAM device 200 may include any desired number of fins while remaining within the scope of the present disclosure. As shown, each of the fins 204-1 and 204-2 is disposed over the substrate 202, and more specifically, protrudes an upper boundary 202U of the substrate 202 to present an aspect ratio of about 3 to 40. For example, the fin 204-1 has a width 205 of about 10 nanometers (nm) to 60 nm, and a height 207 of about 200 nm to 400 nm.

In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, fins 204-1 and 204-2 are formed of a dielectric material such as, for example, silicon dioxide ($SiO_2$). In some embodiments, the fins 204-1 and 204-2 may be formed by at least some of the following processes: depositing a dielectric material ($SiO_2$) over the substrate 202 using chemical vapor deposition (CVD), physical vapor deposition (PVD), spin-on coating, and/or other suitable techniques; forming at least one patterned layer over the dielectric material; using the patterned layer as a mask to etch the dielectric material to form the fins 204-1 and 204-2.

Corresponding to operation 104 of FIG. 1A, FIG. 2B is a cross-sectional view of the RRAM device 200 including a first conductor material 208, which is formed at one of the various stages of fabrication, according to some embodiments. In some embodiments, the first conductor material 208 is substantially conformal and thin (e.g., about 20 nm), such that the first conductor material 208 can overlay the upper boundary 202U of the substrate 202 and further line respective upper boundary 204-1U and sidewalls 204-1$S_1$ and 204-1$S_2$ of the fins 204-1 and respective upper boundary 204-2U and sidewalls 204-2$S_1$ and 204-2$S_2$ of the fins 204-2.

In some embodiments, the first conductor material 208 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), or any alloy, oxide, nitride, fluoride, carbide, boride or silicide of these, such as TaN, TiN, TiAlN, TiW, or a combination thereof. Although the first conductor material 208 is shown as a single layer in the illustrated embodiment of FIG. 2B (and the following figures), it is noted that the first conductor material 208 may include plural layers formed as a stack, wherein each of the plural layers is formed of one of the above-described materials. In some embodiments, the first conductor material 208 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202 and fins 204-1 and 204-2.

Corresponding to operation 106 of FIG. 1A, FIG. 2C is a cross-sectional view of the RRAM device 200 including lower electrodes 210-1A, 210-1B, 210-2A, and 210-2B, which are formed at one of the various stages of fabrication, according to some embodiments. As shown, each of the lower electrodes 210-1A, 210-1B, 210-2A, and 210-2B extends along a first portion of the sidewall of one of the fins 204-1 and 204-2. For example, the lower electrode 210-1A extends along a first portion 212-1 of the sidewall 204-1$S_1$ of the fin 204-1; the lower electrode 210-1B extends along a first portion 214-1 of the sidewall 204-1$S_2$ of the fin 204-1; the lower electrode 210-2A extends along a first portion 216-1 of the sidewall 204-2$S_1$ of the fin 204-2; and the lower electrode 210-2B extends along a first portion 218-1 of the sidewall 204-2$S_2$ of the fin 204-2.

In some embodiments, the lower electrodes 210-1A, 210-1B, 210-2A, and 210-2B are formed by performing at least one etching process 219 on the first conductor material 208. In some embodiments, the etching process 219 may be an anisotropic etching process (e.g., a reactive ion etching (RIE) process) such that the energized ions of the etching process 219 can be directed to bombard on the first conductor material 208 in a substantially vertical direction. Accordingly, a major portion of the first conductor material 208 that overlays the upper boundary 202U of the substrate 202, and respective portions of the first conductor material 208 that line the upper boundary 204-1U and upper portions of the sidewalls 204-1S$_1$ and 204-1S$_2$ of the fin 204-1 and the upper boundary 204-2U and upper portions of the sidewalls 204-2S$_1$ and 204-2S$_2$ of the fin 204-2 (shown in dotted lines) are removed by the etching process 219.

Further, given the anisotropic characteristic of the etching process 219 that etches upper corner portions of the first conductor material 208 more, the remaining portions of the first conductor material 208 (i.e., the lower electrodes 210-1A, 210-1B, 210-2A, and 210-2B) can each have a higher sidewall (with a height of about 40 nm) in contact with the respective sidewall of the fin and a lower sidewall (with a height of about 20~30 nm) substantially parallel to the higher sidewall, in accordance with some embodiments. As such, the respective upper boundary of each of the lower electrodes 210-1A, 210-1B, 210-2A, and 210-2B connecting the higher and lower sidewalls is tilted away from the contacted portion of the sidewall by an acute angel while the respective lower boundary of each of the lower electrodes 210-1A, 210-1B, 210-2A, and 210-2B is in contact with the upper boundary 202U of the substrate 202. As a representative example, the lower electrode 210-1A's sidewall 210-1AS$_1$, not in contact with the first portion 212-1, is lower than the lower electrode 210-1A's sidewall 210-1AS$_1$, in contact with the first portion 212-1, and the lower electrode 210-1A's upper boundary 210-1AU, connecting the sidewalls 210-1AS$_1$ and 210-1AS$_2$, is tilted away from the first portion 212-1 by angle, θ$_1$, that is less than 90 degrees. As shown in the illustrated embodiment of FIG. 2C (and the following figures), other lower electrodes 210-1B, 210-2A, and 210-2B each has a substantially similar profile as the lower electrode 210-1A. Thus, for purposes of clarity of illustration, the discussions of the profiles of the lower electrodes 210-1B, 210-2A, and 210-2B are not repeated again.

Corresponding to operation 108 of FIG. 1A, FIG. 2D is a cross-sectional view of the RRAM device 200 including a selector material 220, which is formed at one of the various stages of fabrication, according to some embodiments. In some embodiments, the selector material 220 is substantially conformal and thin (e.g., about 20 nm), such that the selector material 220 can overlay the re-exposed portion of the upper boundary 202U of the substrate 202, and further line the re-exposed upper boundary 204-1U of the fin 204-1; the re-exposed portions of the sidewalls 204-1S$_1$ and 204-1S$_2$ of the fins 204-1; the re-exposed upper boundary 204-2U of the fin 204-2; the re-exposed portions of the sidewalls 204-2S$_1$ and 204-2S$_2$ of the fin 204-2; the upper boundaries of the lower electrodes 210-1A, 210-1B, 210-2A, and 2104-2B; and the respective sidewalls of the lower electrodes 210-1A, 210-1B, 210-2A, and 210-2B.

In some embodiments, the selector material 220 is mainly formed of a material selected from the chalcogen elements at Group 16 of the periodic table such as, for example, tellurium (Te), selenium (Se) and sulfur (S). In addition to the chalcogen elements, the selector material 220 may further include boron (B), aluminum (Al), gallium (Ga), carbon (C), silicon (Si), germanium (Ge), nitrogen (N), phosphorus (P), arsenic (As), antimony (Ab) and bismuth (Bi). As such, the selector material 220 may be formed of BTe, CTe, BCTe, CSiTe, BSiTe, BCSiTe, BTeN, CTeN, BCTeN, CSiTeN, BSiTeN, or a combination thereof. Although the selector material 220 is shown as a single layer in the illustrated embodiment of FIG. 2D (and the following figures), it is noted that the selector material 220 may include plural layers formed as a stack, wherein each of the plural layers is formed of one of the above-described materials. For example, the selector material 220 may be formed as a two-layer stack, one of which includes a p-type Si, and the other of which includes an n-type Si, or the selector material 220 may be formed as a three-layer stack, one of which includes a p-type Si, another of which includes an intrinsic Si, and the other of which includes an n-type Si. In some embodiments, the selector material 220 is formed by using chemical vapor deposition (CVD), plasma enhanced (PE) CVD, high-density plasma (HDP) CVD, inductively-coupled-plasma (ICP) CVD, physical vapor deposition (PVD), atomic layer deposition (ALD), spin-on coating, and/or other suitable techniques to deposit the at least one of the above-described material over the substrate 202, the fins 204-1 and 204-2, and the lower electrodes 210-1A, 210-1B, 210-2A, and 210-2B.

Figure 2E:
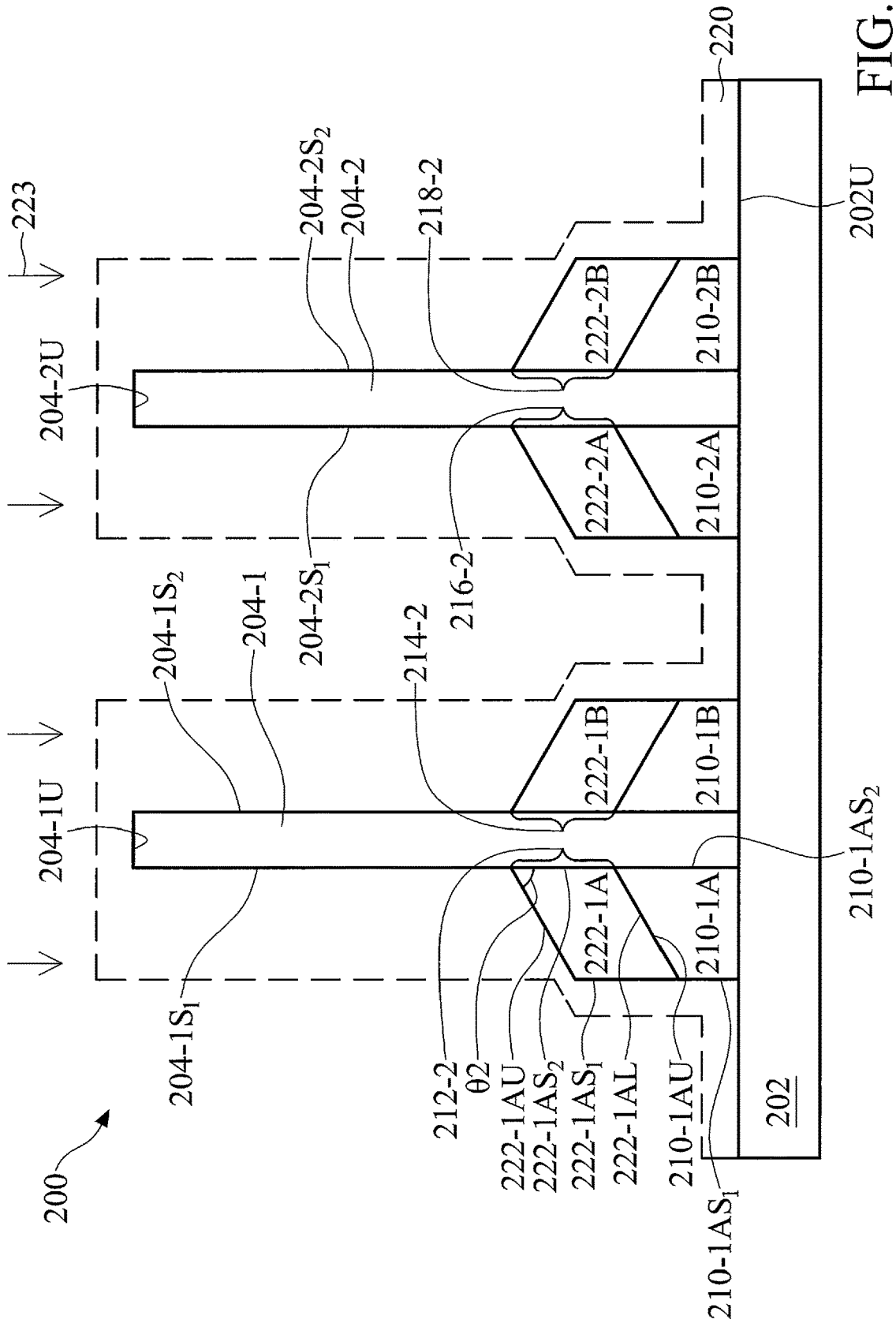

Corresponding to operation 110 of FIG. 1A, FIG. 2E is a cross-sectional view of the RRAM device 200 including selector layers 222-1A, 222-1B, 222-2A, and 222-2B, which are formed at one of the various stages of fabrication, according to some embodiments. As shown, each of the selector layers 222-1A, 222-1B, 222-2A, and 222-2B extends along a second portion of the sidewall of one of the fins 204-1 and 204-2. For example, the selector layer 222-1A extends along a second portion 212-2 of the sidewall 204-1S$_1$ of the fin 204-1; the selector layer 222-1B extends along a second portion 214-2 of the sidewall 204-1S$_2$ of the fin 204-1; the selector layer 222-2A extends along a second portion 216-2 of the sidewall 204-2S$_1$ of the fin 204-2; and the selector layer 222-2B extends along a second portion 218-2 of the sidewall 204-2S$_2$ of the fin 204-2.

In some embodiments, the selector layers 222-1A, 222-1B, 222-2A, and 222-2B are formed by performing at least one etching process 223 on the selector material 220. In some embodiments, the etching process 223 may be an anisotropic etching process (e.g., a reactive ion etching (RIE) process) such that the energized ions of the etching process 223 can be directed to bombard on the selector material 220 in a substantially vertical direction. Accordingly, a major portion of the selector material 220 that overlays the upper boundary 202U of the substrate 202, and respective portions of the selector material 220 that line the upper boundary 204-1U and upper portions of the sidewalls 204-1S$_1$ and 204-1S$_2$ of the fin 204-1 and the upper boundary 204-2U and upper portions of the sidewalls 204-2S$_1$ and 204-2S$_2$ of the fin 204-2 (shown in dotted lines) are removed by the etching process 223.

Further, since the selector material 220 overlays the lower electrodes 210-1A, 210-1B, 210-2A, and 210-2B, the selector layers 222-1A, 222-1B, 222-2A, and 222-2B can each have a lower boundary aligned with the upper boundary of the respective overlaid lower electrode. And given the anisotropic characteristic of the etching process 223, the selector layers 222-1A, 222-1B, 222-2A, and 222-2B (i.e., the remaining portions of the selector material 220) can each have a tilted upper boundary, similar as the ones of the lower electrodes 210-1A, 210-1B, 210-2A, and 210-2B, and the respective sidewalls of each of the selector layers 222-1A, 222-1B, 222-2A, and 222-2B, connecting such upper and lower boundaries, may be with a same height and substantially parallel with the contacted portion of the sidewall of the respective fin. Further, the respective sidewalls of each of the selector layers 222-1A, 222-1B, 222-2A, and 222-2B may be aligned with the respective sidewalls of the overlaid lower electrodes 210-1A, 210-1B, 210-2A, and 210-2B.

As a representative example, the selector layer 222-1A's lower boundary 222-1AL is in contact with the upper boundary 210-1AU of the lower electrode 210-1A and the selector layer 222-1A's upper boundary 222-1AU is tilted away from the second portion 212-2 by angle, $\theta_2$, that is less than 90 degrees. The selector layer 222-1A's sidewalls 222-1AS$_1$ and 222-1AS$_2$, respectively connecting the upper and lower boundaries 222-1AU and 222-1AL, have a same height (e.g., about 25 nm) and are substantially parallel with the contacted portion 212-2. Further, in some embodiments, the selector layer 222-1A's sidewalls 222-1AS$_1$ and 222-1AS$_2$ are also aligned with the sidewalls 210-1AS$_1$ and 210-1AS$_2$ of the lower electrode 210-1A, respectively. Accordingly, in some embodiments, the selector layers 222-1A, 222-1B, 222-2A, and 222-2B may be referred to as having a rhomboid-based profile (i.e., a parallelogram in which adjacent sides are of unequal lengths and angles are non-right angles) or a rhombus-based profile (i.e., a parallelogram in which adjacent sides are of equal lengths and angles are non-right angles). As shown in the illustrated embodiment of FIG. 2E (and the following figures), other selector layers 222-1B, 222-2A, and 222-2B each has a substantially similar profile as the selector layer 222-1A. Thus, for purposes of clarity of illustration, the discussions of the profiles of the selector layers 222-1B, 222-2A, and 222-2B are not repeated again.

Figure 2F:
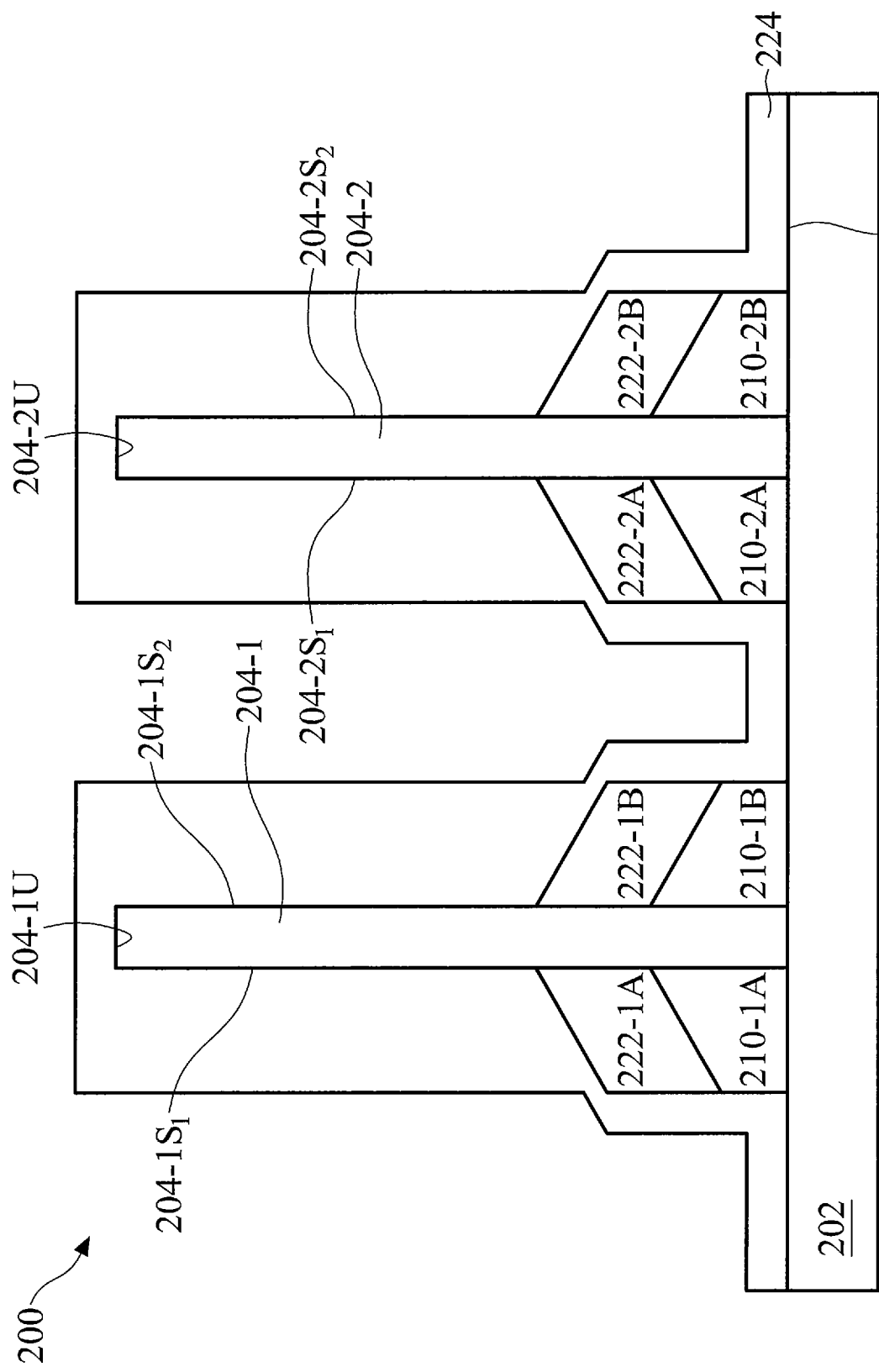

Corresponding to operation 112 of FIG. 1A, FIG. 2F is a cross-sectional view of the RRAM device 200 including a second conductor material 224, which is formed at one of the various stages of fabrication, according to some embodiments. In some embodiments, the second conductor material 224 is substantially conformal and thin (e.g., about 20 nm), such that the second conductor material 224 can overlay the re-exposed portion of the upper boundary 202U of the substrate 202, and further line the re-exposed upper boundary 204-1U of the fin 204-1; the re-exposed portions of the sidewalls 204-1S$_1$ and 204-1S$_2$ of the fins 204-1; the re-exposed upper boundary 204-2U of the fin 204-2; the re-exposed portions of the sidewalls 204-2S$_1$ and 204-2S$_2$ of the fin 204-2; the upper boundaries of the selector layers 222-1A, 222-1B, 222-2A, and 222-2B; and the respective sidewalls of the selector layers 222-1A, 222-1B, 222-2A, and 222-2B, and lower electrodes 210-1A, 210-1B, 210-2A, and 210-2B.

In some embodiments, the second conductor material 224 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), or any alloy, oxide, nitride, fluoride, carbide, boride or silicide of these, such as TaN, TiN, TiAlN, TiW, or a combination thereof. Although the second conductor material 224 is shown as a single layer in the illustrated embodiment of FIG. 2F (and the following figures), it is noted that the second conductor material 224 may include plural layers formed as a stack, wherein each of the plural layers is formed of one of the above-described materials. In some embodiments, the second conductor material 224 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202, fins 204-1 and 204-2, and selector layers 222-1A, 222-1B, 222-2A, and 222-2B.

Figure 2G:
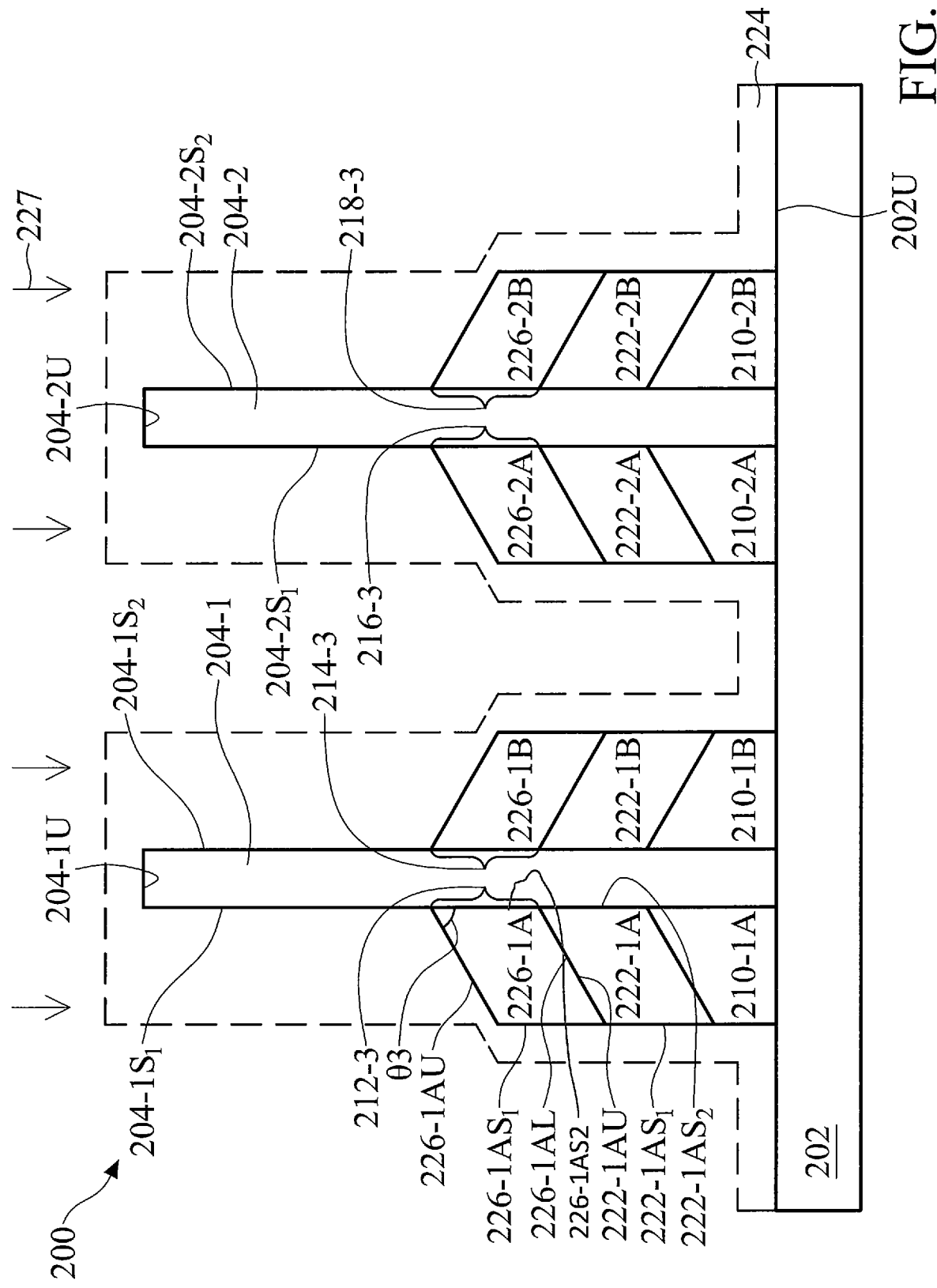

Corresponding to operation 114 of FIG. 1A, FIG. 2G is a cross-sectional view of the RRAM device 200 including intermediate electrodes 226-1A, 226-1B, 226-2A, and 226-2B, which are formed at one of the various stages of fabrication, according to some embodiments. As shown, each of the intermediate electrodes 226-1A, 226-1B, 226-2A, and 226-2B extends along a third portion of the sidewall of one of the fins 204-1 and 204-2. For example, the intermediate electrode 226-1A extends along a third portion 212-3 of the sidewall 204-1S$_1$ of the fin 204-1; the intermediate electrode 226-1B extends along a third portion 214-3 of the sidewall 204-1S$_2$ of the fin 204-1; the intermediate electrode 226-2A extends along a third portion 216-3 of the sidewall 204-2S$_1$ of the fin 204-2; and the intermediate electrode 226-2B extends along a third portion 218-3 of the sidewall 204-2S$_2$ of the fin 204-2.

In some embodiments, the intermediate electrodes 226-1A, 226-1B, 226-2A, and 226-2B are formed by performing at least one etching process 227 on the second conductor material 224. In some embodiments, the etching process 227 may be an anisotropic etching process (e.g., a reactive ion etching (RIE) process) such that the energized ions of the etching process 227 can be directed to bombard on the second conductor material 224 in a substantially vertical direction. Accordingly, a major portion of the second conductor material 224 that overlays the upper boundary 202U of the substrate 202, and respective portions of the second conductor material 224 that line the upper boundary 204-1U and upper portions of the sidewalls 204-1S$_1$ and 204-1S$_2$ of the fin 204-1 and the upper boundary 204-2U and upper portions of the sidewalls 204-2S$_1$ and 204-2S$_2$ of the fin 204-2 (shown in dotted lines) are removed by the etching process 227.

Further, since the second conductor material 224 overlays the selector layers 222-1A, 222-1B, 222-2A, and 222-2B, the intermediate electrodes 226-1A, 226-1B, 226-2A, and 226-2B can each have a lower boundary aligned with the upper boundary of the respective overlaid selector layer. And given the anisotropic characteristic of the etching process 227, the intermediate electrodes 226-1A, 226-1B, 226-2A, and 226-2B (i.e., the remaining portions of the second conductor material 224) can each have a tilted upper boundary, similar as the ones of the selector layers 222-1A, 222-1B, 222-2A, and 222-2B, and the respective sidewalls of each of the intermediate electrodes 226-1A, 226-1B, 226-2A, and 226-2B, connecting such upper and lower boundaries, may be with a same height and substantially parallel with the contacted portion of the sidewall of the respective fin. Further, the respective sidewalls of each of the intermediate electrodes 226-1A, 226-1B, 226-2A, and 226-2B may be aligned with the respective sidewalls of the overlaid selector layers 222-1A, 222-1B, 222-2A, and 222-2B.

As a representative example, the intermediate electrode 226-1A's lower boundary 226-1AL is in contact with the upper boundary 222-1AU of the selector layer 222-1A and the intermediate electrode 226-1A's upper boundary 226-1AU is tilted away from the third portion 212-3 by angle, $\theta_3$, that is less than 90 degrees. The intermediate electrode 226-1A's sidewalls 226-1AS$_1$ and 226-1AS$_2$, respectively connecting the upper and lower boundaries 226-1AU and 226-1AL, have a same height (e.g., about 20 nm) and are substantially parallel with the contacted portion 212-3. Further, in some embodiments, the intermediate electrode 226-1A's sidewalls 226-IAS$_1$ and 226-1AS$_2$ are also aligned with the sidewalls 222-1AS$_1$ and 222-1AS$_2$ of the selector layer 222-1A, respectively. Accordingly, in some embodiments, the intermediate electrodes 226-1A, 226-1B, 226-2A, and 226-2B may be referred to as having a rhomboid-based profile (i.e., a parallelogram in which adjacent sides are of unequal lengths and angles are non-right angles) or a rhombus-based profile (i.e., a parallelogram in which adjacent sides are of equal lengths and angles are non-right angles). As shown in the illustrated embodiment of FIG. 2G (and the following figures), other intermediate electrodes 226-1B, 226-2A, and 226-2B each has a substantially similar profile as the intermediate electrodes 226-1A. Thus, for purposes of clarity of illustration, the discussions of the profiles of the intermediate electrodes 226-1B, 226-2A, and 226-2B are not repeated again.

Figure 2H:
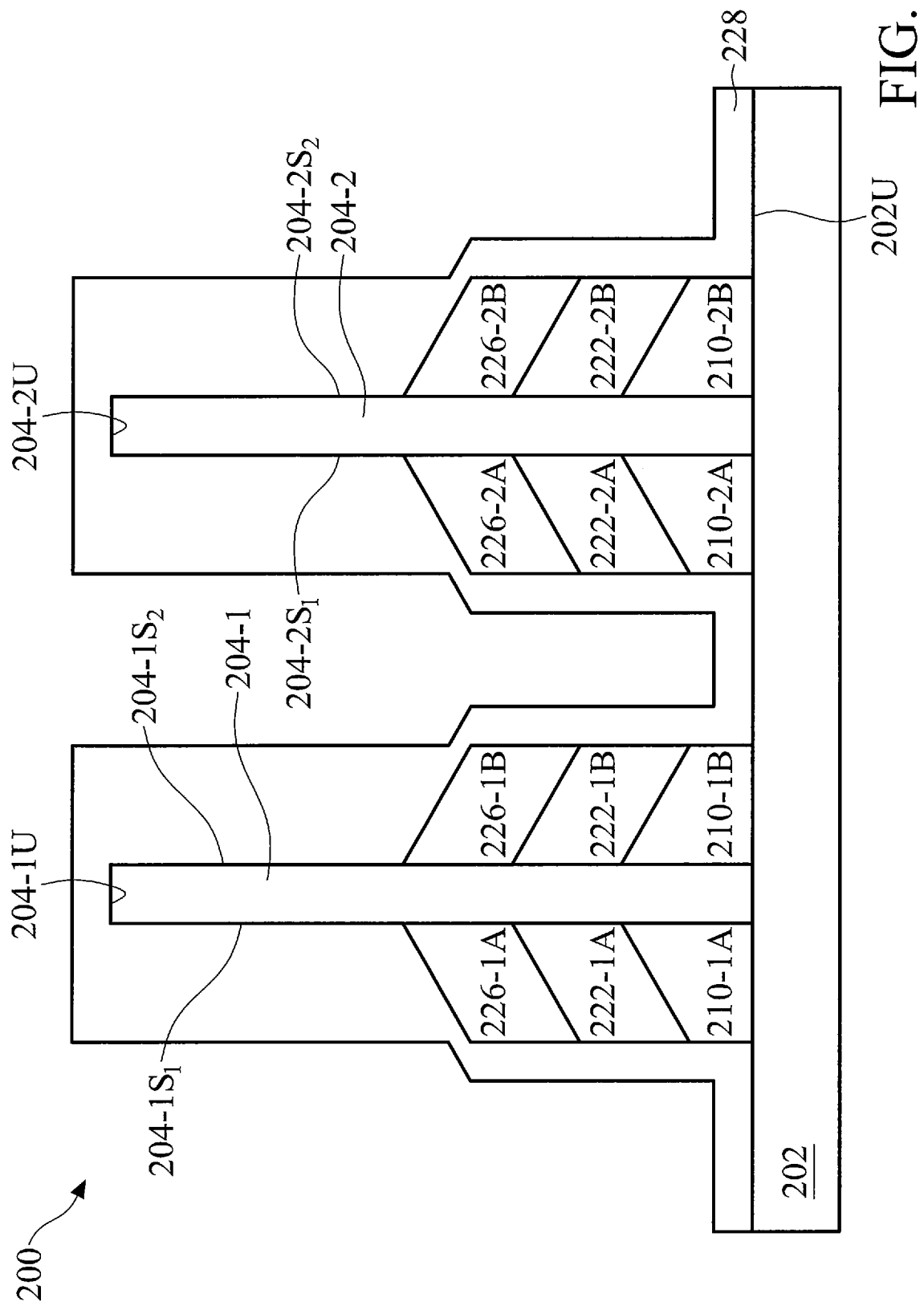

Corresponding to operation 116 of FIG. 1B, FIG. 2H is a cross-sectional view of the RRAM device 200 including a variable resistive material 228, which is formed at one of the various stages of fabrication, according to some embodiments. In some embodiments, the variable resistive material 228 is substantially conformal and thin (e.g., about 20 nm), such that the variable resistive material 228 can overlay the re-exposed portion of the upper boundary 202U of the substrate 202, and further line the re-exposed upper boundary 204-1U of the fin 204-1; the re-exposed portions of the sidewalls 204-1S$_1$ and 204-1S$_2$ of the fins 204-1; the re-exposed upper boundary 204-2U of the fin 204-2; the re-exposed portions of the sidewalls 204-2S$_1$ and 204-2S$_2$ of the fin 204-2; the upper boundaries of the intermediate electrodes 226-1A, 226-1B, 226-2A, and 226-2B; and the respective sidewalls of the intermediate electrodes 226-1A, 226-1B, 226-2A, and 226-2B, selector layers 222-1A, 222-1B, 222-2A, and 222-2B, and lower electrodes 210-1A, 210-1B, 210-2A, and 210-2B.

In one embodiment, the variable resistive material 228 may include a transition metal oxide. The transition metal oxide may be denoted as $M_xO_y$, where M is a transition metal, O is oxygen, x is the transition metal composition, and y is the oxygen composition. In an embodiment, the variable resistive material 228 includes $ZrO_2$. Examples of other materials suitable for the variable resistive material 228 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive material 228 may include a colossal magnetoresistance (CMR)-based material such as, for example, $Pr_{0.7}Ca_{0.3}$, $MnO_3$, etc.

In yet another embodiment, the variable resistive material 228 may include a polymer material such as, for example, polyvinylidene fluoride and poly[(vinylidenefluoride-co-trifluoroethylene] (P(VDF/TrFE)). In yet another embodiment, the variable resistive material 280 may include a conductive-bridging random access memory (CBRAM) material such as, for example, Ag in GeSe. According to some embodiments, the variable resistive material 228 may include multiple layers having characteristics of a resistance conversion material. A set voltage and/or a reset voltage of the variable resistive material 228 may be determined by the variable resistive material 228's compositions (including the values of "x" and "y"), thickness, and/or other factors known in the art.

In some embodiments, the variable resistive material 228 may be formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202, fins 204-1 and 204-2, and intermediate electrodes 226-1A, 226-1B, 226-2A, and 226-2B.

Figure 2I:
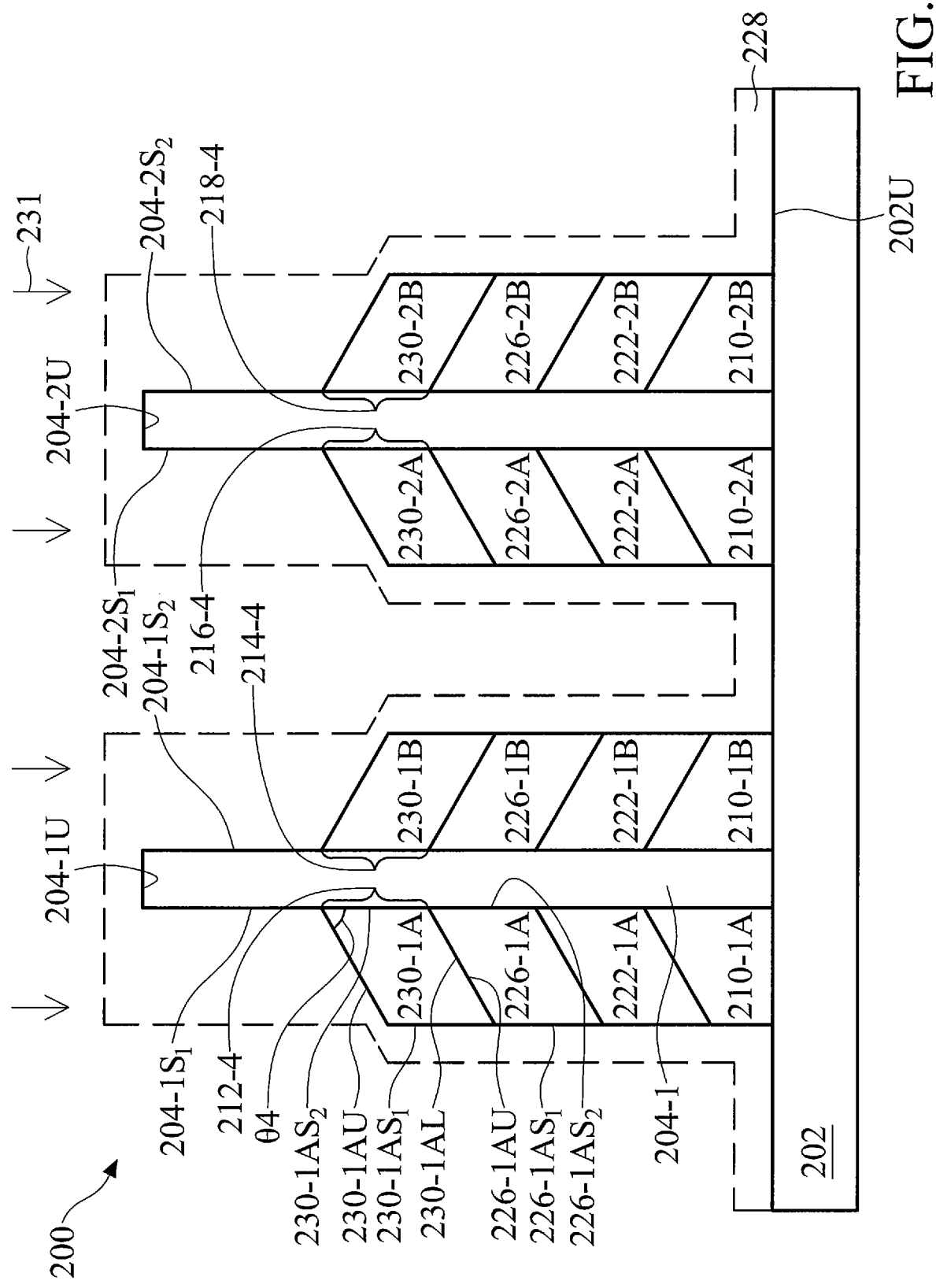

Corresponding to operation 118 of FIG. 1B, FIG. 2I is a cross-sectional view of the RRAM device 200 including variable resistive material layers 230-1A, 230-1B, 230-2A, and 230-2B, which are formed at one of the various stages of fabrication, according to some embodiments. As shown, each of the variable resistive material layers 230-1A, 230-1B, 230-2A, and 230-2B extends along a fourth portion of the sidewall of one of the fins 204-1 and 204-2. For example, the variable resistive material layer 230-1A extends along a fourth portion 212-4 of the sidewall 204-1S$_1$ of the fin 204-1; the variable resistive material layer 230-1B extends along a fourth portion 214-4 of the sidewall 204-1S$_2$ of the fin 204-1; the variable resistive material layer 230-2A extends along a fourth portion 216-4 of the sidewall 204-2S$_1$ of the fin 204-2; and the variable resistive material layers 230-2B extends along a fourth portion 218-4 of the sidewall 204-2S$_2$ of the fin 204-2.

In some embodiments, the variable resistive material layers 230-1A, 230-1B, 230-2A, and 230-2B are formed by performing at least one etching process 231 on the variable resistive material 228. In some embodiments, the etching process 231 may be an anisotropic etching process (e.g., a reactive ion etching (RIE) process) such that the energized ions of the etching process 231 can be directed to bombard on the variable resistive material 228 in a substantially vertical direction. Accordingly, a major portion of the variable resistive material 228 that overlays the upper boundary 202U of the substrate 202, and respective portions of the variable resistive material 228 that line the upper boundary 204-1U and upper portions of the sidewalls 204-1S$_1$ and 204-1S$_2$ of the fin 204-1 and the upper boundary 204-2U and upper portions of the sidewalls 204-2S$_1$ and 204-2S$_2$ of the fin 204-2 (shown in dotted lines) are removed by the etching process 231.

Further, since the variable resistive material 228 overlays the intermediate electrodes 226-1A, 226-1B, 226-2A, and 226-2B, the variable resistive material layers 230-1A, 230-1B, 230-2A, and 230-2B can each have a lower boundary aligned with the upper boundary of the respective overlaid intermediate electrode. And given the anisotropic characteristic of the etching process 231, the variable resistive material layers 230-1A, 230-1B, 230-2A, and 230-2B (i.e., the remaining portions of the variable resistive material 228) can each have a tilted upper boundary, similar as the ones of the intermediate electrodes 226-1A, 226-1B, 226-2A, and 226-2B, and the respective sidewalls of each of the variable resistive material layers 230-1A, 230-1B, 230-2A, and 230-2B, connecting such upper and lower boundaries, may be with a same height and substantially parallel with the contacted portion of the sidewall of the respective fin. Further, the respective sidewalls of each of the variable resistive material layers 230-1A, 230-1B, 230-2A, and 230-2B may be aligned with the respective sidewalls of the overlaid intermediate electrodes 226-1A, 226-1B, 226-2A, and 226-2B.

As a representative example, the variable resistive material layer 230-1A's lower boundary 230-1AL is in contact with the upper boundary 226-1AU of the intermediate electrode 226-1A and the variable resistive material layer 230-1A's upper boundary 230-1AU is tilted away from the fourth portion 212-4 by angle, $\theta_4$, that is less than 90 degrees. The variable resistive material layer 230-1A's sidewalls 230-1AS$_1$ and 230-1AS$_2$, respectively connecting the upper and lower boundaries 230-1AU and 230-1AL, have a same height (e.g., about 25 nm) and are substantially parallel with the contacted portion 212-4. Further, in some embodiments, the variable resistive material layer 230-1A's sidewalls 230-1AS$_1$ and 230-1AS$_2$ are also aligned with the sidewalls 226-1AS$_1$ and 226-1AS$_2$ of the intermediate electrode 226-1A, respectively. Accordingly, in some embodiments, the variable resistive material layers 230-1A, 230-1B, 230-2A, and 230-2B may be referred to as having a rhomboid-based profile (i.e., a parallelogram in which adjacent sides are of unequal lengths and angles are non-right angles) or a rhombus-based profile (i.e., a parallelogram in which adjacent sides are of equal lengths and angles are non-right angles). As shown in the illustrated embodiment of FIG. 2I (and the following figures), other variable resistive material layers 230-1B, 230-2A, and 230-2B each has a substantially similar profile as the variable resistive material layer 230-1A. Thus, for purposes of clarity of illustration, the discussions of the profiles of the variable resistive material layers 230-1B, 230-2A, and 230-2B are not repeated again.

Figure 2J:
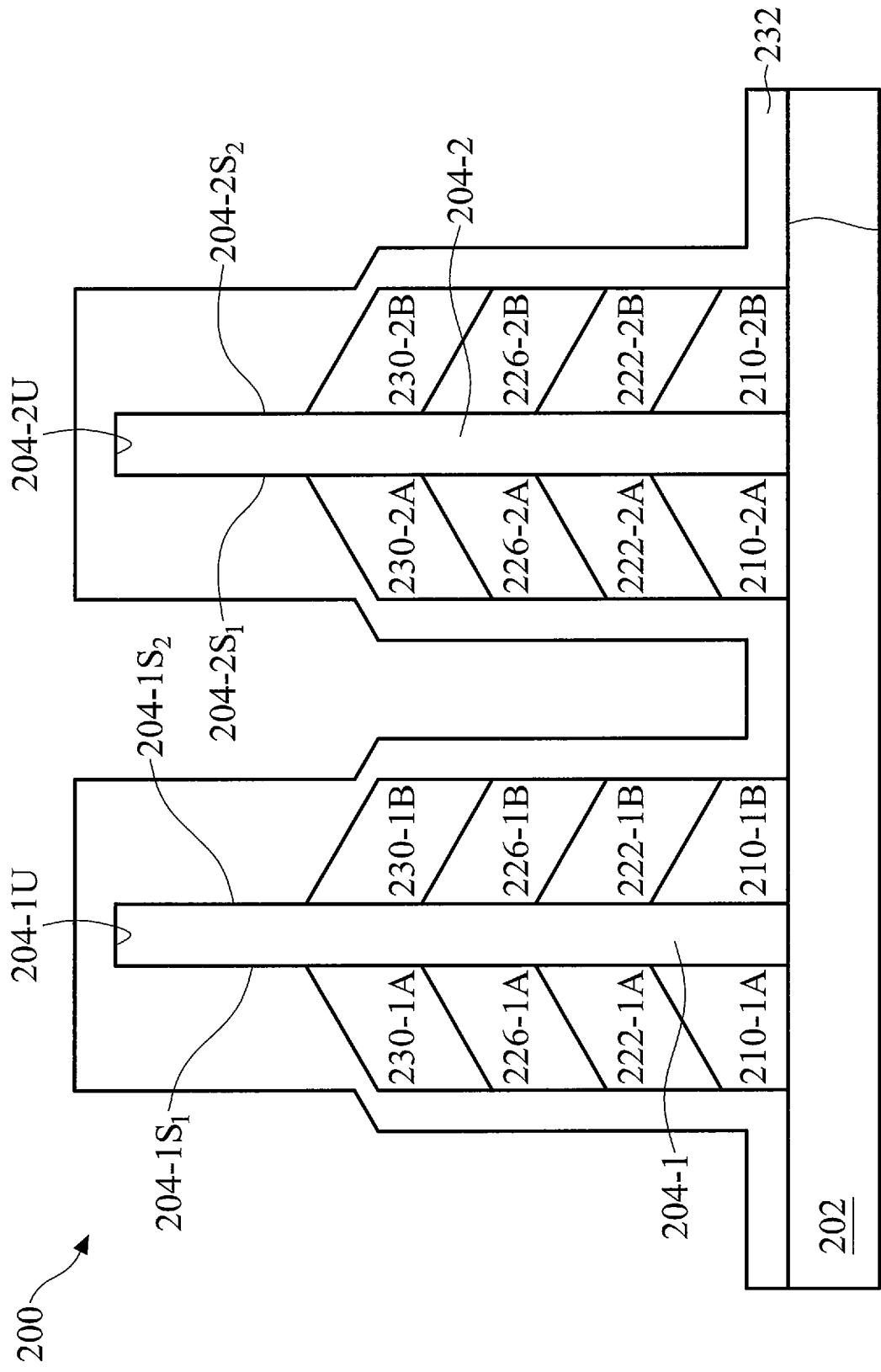

Corresponding to operation 120 of FIG. 1B, FIG. 2J is a cross-sectional view of the RRAM device 200 including a third conductor material 232, which is formed at one of the various stages of fabrication, according to some embodiments. In some embodiments, the third conductor material 232 is substantially conformal and thin (e.g., about 20 nm), such that the third conductor material 232 can overlay the re-exposed portion of the upper boundary 202U of the substrate 202, and further line the re-exposed upper boundary 204-1U of the fin 204-1; the re-exposed portions of the sidewalls 204-1S$_1$ and 204-1S$_2$ of the fins 204-1; the re-exposed upper boundary 204-2U of the fin 204-2; the re-exposed portions of the sidewalls 204-2S$_1$ and 204-2S$_2$ of the fin 204-2; the upper boundaries of the variable resistive material layers 230-1A, 230-1B, 230-2A, and 230-2B; and the respective sidewalls of the variable resistive material layers 230-1A, 230-1B, 230-2A, and 230-2B, intermediate electrodes 226-1A, 226-1B, 226-2A, and 226-2B, selector layers 222-1A, 222-1B, 222-2A, and 222-2B, and lower electrodes 210-1A, 210-1B, 210-2A, and 210-2B.

In some embodiments, the third conductor material 232 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), or any alloy, oxide, nitride, fluoride, carbide, boride or silicide of these, such as TaN, TiN, TiAlN, TiW, or a combination thereof. Although the third conductor material 232 is shown as a single layer in the illustrated embodiment of FIG. 2J (and the following figures), it is noted that the third conductor material 232 may include plural layers formed as a stack, wherein each of the plural layers is formed of one of the above-described materials. In some embodiments, the third conductor material 232 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202, fins 204-1 and 204-2, and variable resistive material layers 226-1A, 226-1B, 226-2A, and 226-2B.

Figure 2K:
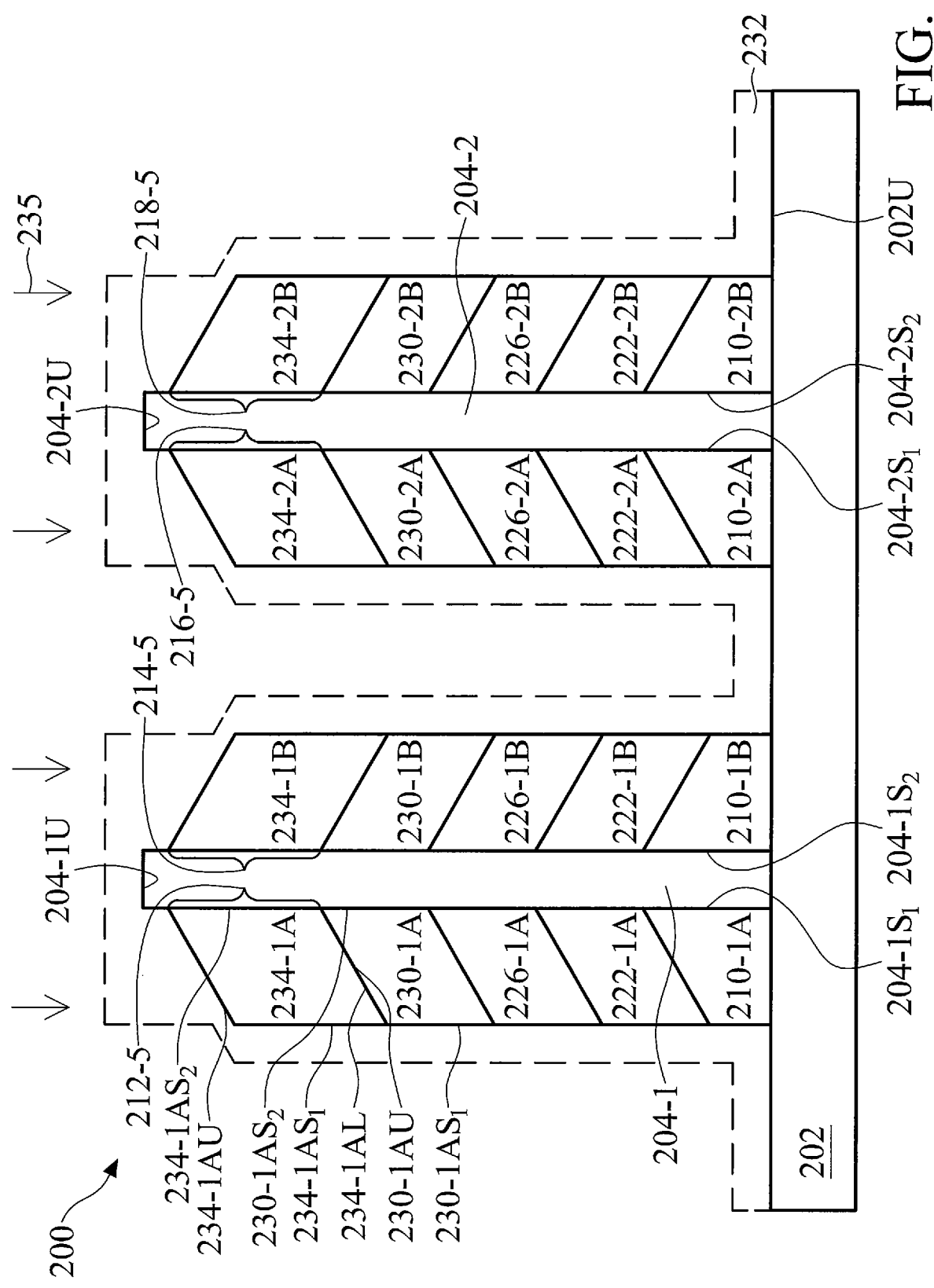
Figure 2N:
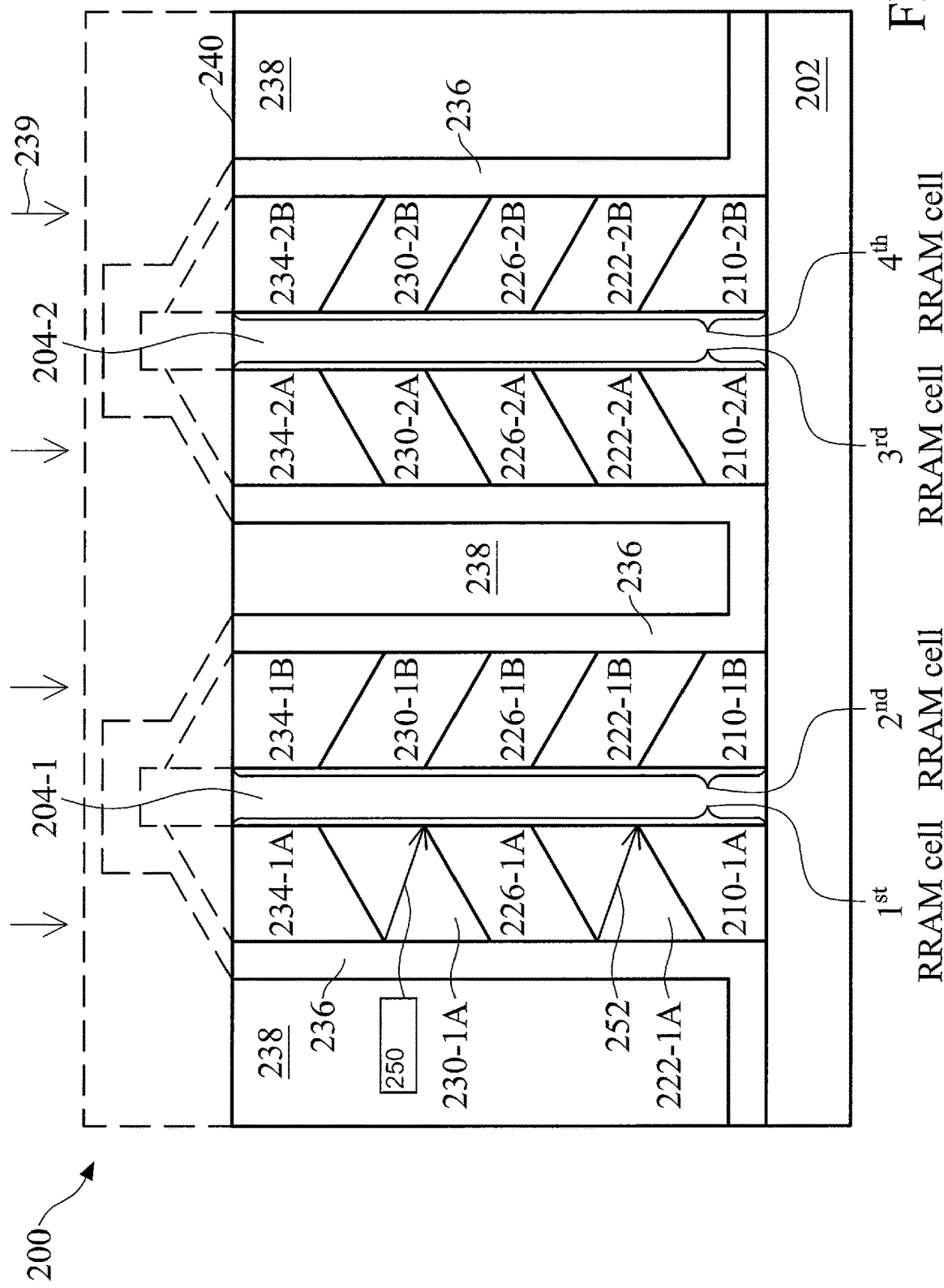

Corresponding to operation 122 of FIG. 1B, FIG. 2K is a cross-sectional view of the RRAM device 200 including upper electrodes 234-1A, 234-1B, 234-2A, and 234-2B, which are formed at one of the various stages of fabrication, according to some embodiments. As shown, each of the upper electrodes 234-1A, 234-1B, 234-2A, and 234-2B extends along a fifth portion of the sidewall of one of the fins 204-1 and 204-2. For example, the upper electrode 234-1A extends along a fifth portion 212-5 of the sidewall 204-1S$_1$ of the fin 204-1; the upper electrode 234-1B extends along a fifth portion 214-5 of the sidewall 204-1S$_2$ of the fin 204-1; the upper electrode 234-2A extends along a fifth portion 216-5 of the sidewall 204-2S$_1$ of the fin 204-2; and the upper electrode 234-2B extends along a fifth portion 218-5 of the sidewall 204-2S$_2$ of the fin 204-2.

In some embodiments, the upper electrodes 234-1A, 234-1B, 234-2A, and 234-2B are formed by performing at least one etching process 235 on the third conductor material 232. In some embodiments, the etching process 235 may be an anisotropic etching process (e.g., a reactive ion etching (RIE) process) such that the energized ions of the etching process 235 can be directed to bombard on the third conductor material 232 in a substantially vertical direction. Accordingly, a major portion of the third conductor material 232 that overlays the upper boundary 202U of the substrate 202, and respective portions of the third conductor material 232 that line the upper boundary 204-1U and upper portions of the sidewalls 204-1S$_1$ and 204-1S$_2$ of the fin 204-1 and the upper boundary 204-2U and upper portions of the sidewalls 204-2S$_1$ and 204-2S$_2$ of the fin 204-2 (shown in dotted lines) are removed by the etching process 235.

Further, since the third conductor material 232 overlays the variable resistive material layers 230-1A, 230-1B, 230-2A, and 230-2B, the upper electrodes 234-1A, 234-1B, 234-2A, and 234-2B can each have a lower boundary aligned with the upper boundary of the respective overlaid variable resistive material layer. And given the anisotropic characteristic of the etching process 235, the upper electrodes 234-1A, 234-1B, 234-2A, and 234-2B (i.e., the remaining portions of the third conductor material 232) can each have a tilted upper boundary, similar as the ones of the variable resistive material layers 230-1A, 230-1B, 230-2A, and 230-2B, and the respective sidewalls of each of the upper electrodes 234-1A, 234-1B, 234-2A, and 234-2B, connecting such upper and lower boundaries, may be with a same height and substantially parallel with the contacted portion of the sidewall of the respective fin. Further, the respective sidewalls of each of the upper electrodes 234-1A, 234-1B, 234-2A, and 234-2B may be aligned with the respective sidewalls of the overlaid variable resistive material layers 230-1A, 230-1B, 230-2A, and 230-2B.

As a representative example, the upper electrode 234-1A's lower boundary 234-1AL is in contact with the upper boundary 230-1AU of the variable resistive material layer 230-1A and the upper electrode 234-1A's upper boundary 234-1AU is tilted away from the fifth portion 212-5 by angle, $\theta_5$, that is less than 90 degrees. The upper electrode 234-1A's sidewalls 234-1AS$_1$ and 234-1AS$_2$, respectively connecting the upper and lower boundaries 234-1AU and 234-1AL, have a same height (e.g., about 40 nm) and are substantially parallel with the contacted portion 212-5. Further, in some embodiments, the upper electrode 234-1A's sidewalls 234-1AS$_1$ and 234-1AS$_2$ are also aligned with the sidewalls 230-1AS$_1$ and 230-1AS$_2$ of the variable resistive material layer 230-1A, respectively. Accordingly, in some embodiments, the upper electrodes 234-1A, 234-1B, 234-2A, and 234-2B may be referred to as having a rhomboid-based profile (i.e., a parallelogram in which adjacent sides are of unequal lengths and angles are non-right angles) or a rhombus-based profile (i.e., a parallelogram in which adjacent sides are of equal lengths and angles are non-right angles). As shown in the illustrated embodiment of FIG. 2K (and the following figures), other upper electrodes 234-1B, 234-2A, and 234-2B each has a substantially similar profile as the upper electrode 234-1A. Thus, for purposes of clarity of illustration, the discussions of the profiles of the upper electrodes 234-1B, 234-2A, and 234-2B are not repeated again.

In some embodiments, θ1 from the lower electrode 210-1A, θ2 from the selector layer 222-1A, the intermediate electrode 226-1A, θ3 from the intermediate electrode 226-1A, θ4 from the variable resistive material layer 230-1A, and θ5 from the upper electrodes 234-1A can be equal and are less than 90 degrees. In some embodiments, the 5 angles are the same. In some other embodiments, the 5 angles are different which is controlled by the respective etching processes and environment on the materials of the corresponding layers.

Corresponding to operation 124 of FIG. 1B, FIG. 2L is a cross-sectional view of the RRAM device 200 including a capping layer 236, which is formed at one of the various stages of fabrication, according to some embodiments. In some embodiments, the capping layer 236 is substantially conformal and thin (e.g., about 3 nm), such that the capping layer 236 can overlay the re-exposed portion of the upper boundary 202U of the substrate 202, and further line the re-exposed upper boundary 204-1U of the fin 204-1; the re-exposed portions of the sidewalls 204-1S$_1$ and 204-1S$_2$ of the fins 204-1; the re-exposed upper boundary 204-2U of the fin 204-2; the re-exposed portions of the sidewalls 204-2S$_1$ and 204-2S$_2$ of the fin 204-2; the upper boundaries of the upper electrodes 234-1A, 234-1B, 234-2A, and 234-2B; and the respective sidewalls of the upper electrodes 234-1A, 234-1B, 234-2A, and 234-2B, variable resistive material layers 230-1A, 230-1B, 230-2A, and 230-2B, intermediate electrodes 226-1A, 226-1B, 226-2A, and 226-2B, selector layers 222-1A, 222-1B, 222-2A, and 222-2B, and lower electrodes 210-1A, 210-1B, 210-2A, and 210-2B.

In some embodiments, the capping layer 236 may include a material selected from a group consisting of: oxide, silicon rich oxide, silicon carbide (SiC), silicon nitride (SiN), or a combination thereof. In some embodiments, the capping layer 236 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202, fins 204-1 and 204-2, and upper electrodes 234-1A, 234-1B, 234-2A, and 234-2B.

Corresponding to operation 126 of FIG. 1C, FIG. 2M is a cross-sectional view of the RRAM device 200 including a dielectric material 238, which is formed at one of the various stages of fabrication, according to some embodiments. As shown, the dielectric material 238 is formed to overlay the substrate 202 and fins 204-1 and 204-2 with a relatively thicker thickness compared to the height of the fins 204-1 and 204-2 (e.g., about 250 nm) to cause the dielectric material 238 to fill gap(s) between adjacent fins 204-1 and 204-2.

In some embodiments, the dielectric material 238 may include a material selected from a group consisting of: oxide, silicon rich oxide, silicon carbide (SiC), silicon nitride (SiN), or a combination thereof. In some embodiments, the dielectric material 238 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202, fins 204-1 and 204-2, and upper electrodes 234-1A, 234-1B, 234-2A, and 234-2B.

Corresponding to operation 128 of FIG. 1C, FIG. 2N is a cross-sectional view of the RRAM device 200 in which a polishing process 239 is performed at one of the various stages of fabrication, according to some embodiments. As shown, the polishing process (e.g., a chemical-mechanical polishing (CMP) process) 239 is performed to polish an upper portion of the dielectric material 238; an upper portion of the capping layer 236; respective upper portions of the fins 204-1 and 204-2; and respective upper portions of the upper electrodes 234-1A, 234-1B, 234-2A, and 234-2B (shown in dotted lines) so to produce a coplanar boundary 240. In some embodiments, such a coplanar boundary 240 is shared by at least respective new upper boundaries of the upper electrodes 234-1A, 234-1B, 234-2A, and 234-2B.

In some embodiments, after operation 128 of the method 100, one or more RRAM cells may be formed. More specifically, the upper electrode, variable resistive material layer, intermediate electrode, selector layer, and lower electrode extending along one of the sidewalls of one of the fins 204-1 and 204-1 may form one RRAM cell. For example, the upper electrode 234-1A, variable resistive material layer 230-1A, intermediate electrode 226-1A, selector layer 222-1A, and lower electrode 210-1A may form a first RRAM cell; the upper electrode 234-1B, variable resistive material layer 230-1B, intermediate electrode 226-1B, selector layer 222-1B, and lower electrode 210-1B may form a second RRAM cell; the upper electrode 234-2A, variable resistive material layer 230-2A, intermediate electrode 226-2A, selector layer 222-2A, and lower electrode 210-2A may form a third RRAM cell; and the upper electrode 234-2B, variable resistive material layer 230-2B, intermediate electrode 226-2B, selector layer 222-2B, and lower electrode 210-2B may form a fourth RRAM cell.

In some embodiments, since each of the variable resistive material layers 230-1A, 230-1B, 230-2A, and 230-2B is configured to present a variable resistance value, as mentioned above, and each of the selector layers 222-1A, 222-1B, 222-2A, and 222-2B that includes at least one chalcogen element is configured to present an Ovonic Threshold Switch (OTS) characteristic, each of the first, second, third, and fourth RRAM cells may be further divided into a memory portion and a selector portion coupled in series. The memory portion is configured to present either a logic 1 through transitioning its resistance state to the LRS (low resistance state) or a logic 0 through transitioning its resistance state to the HRS (high resistance state) and the selector portion is configured to electrically conduct itself to allow the serially coupled memory portion to be written or read, e.g., written with either a logic 1 or 0.

For example, the memory portion of the first RRAM cell may be formed by the upper electrode 234-1A, variable resistive material layer 230-1A, and intermediate electrode 226-1A and the selector portion of the first RRAM cell may be formed by the intermediate electrode 226-1A, selector layer 222-1A, and lower electrode 210-1A; the memory portion of the second RRAM cell may be formed by the upper electrode 234-1B, variable resistive material layer 230-1B, and intermediate electrode 226-1B and the selector portion of the second RRAM cell may be formed by the intermediate electrode 226-1B, selector layer 222-1B, and lower electrode 210-1B; the memory portion of the third RRAM cell may be formed by the upper electrode 234-2A, variable resistive material layer 230-2A, and intermediate electrode 226-2A and the selector portion of the third RRAM cell may be formed by the intermediate electrode 226-2A, selector layer 222-2A, and lower electrode 210-2A; and the memory portion of the fourth RRAM cell may be formed by the upper electrode 234-2B, variable resistive material layer 230-2B, and intermediate electrode 226-2B and the selector portion of the fourth RRAM cell may be formed by the intermediate electrode 226-2B, selector layer 222-2B, and lower electrode 210-2B.

In some embodiments, since the first, second, third, and fourth RRAM cells' respective selector layers and variable resistive material layers each presents a rhomboid-based or rhombus-based profile, a directional conduction path can be formed across two opposite angles of the rhomboid-based or rhombus-based profile, for example, directional conduction path 250 formed in the selector layer 222-1A, directional conduction path 252 formed in the variable resistive material layer 230-1A, etc. The formation of such directional conduction paths may be due to the relatively high electric field strength occurring at the opposite angles of the rhomboid-based or rhombus-based profile, which is typically known as a corona discharge.

Figure 3:
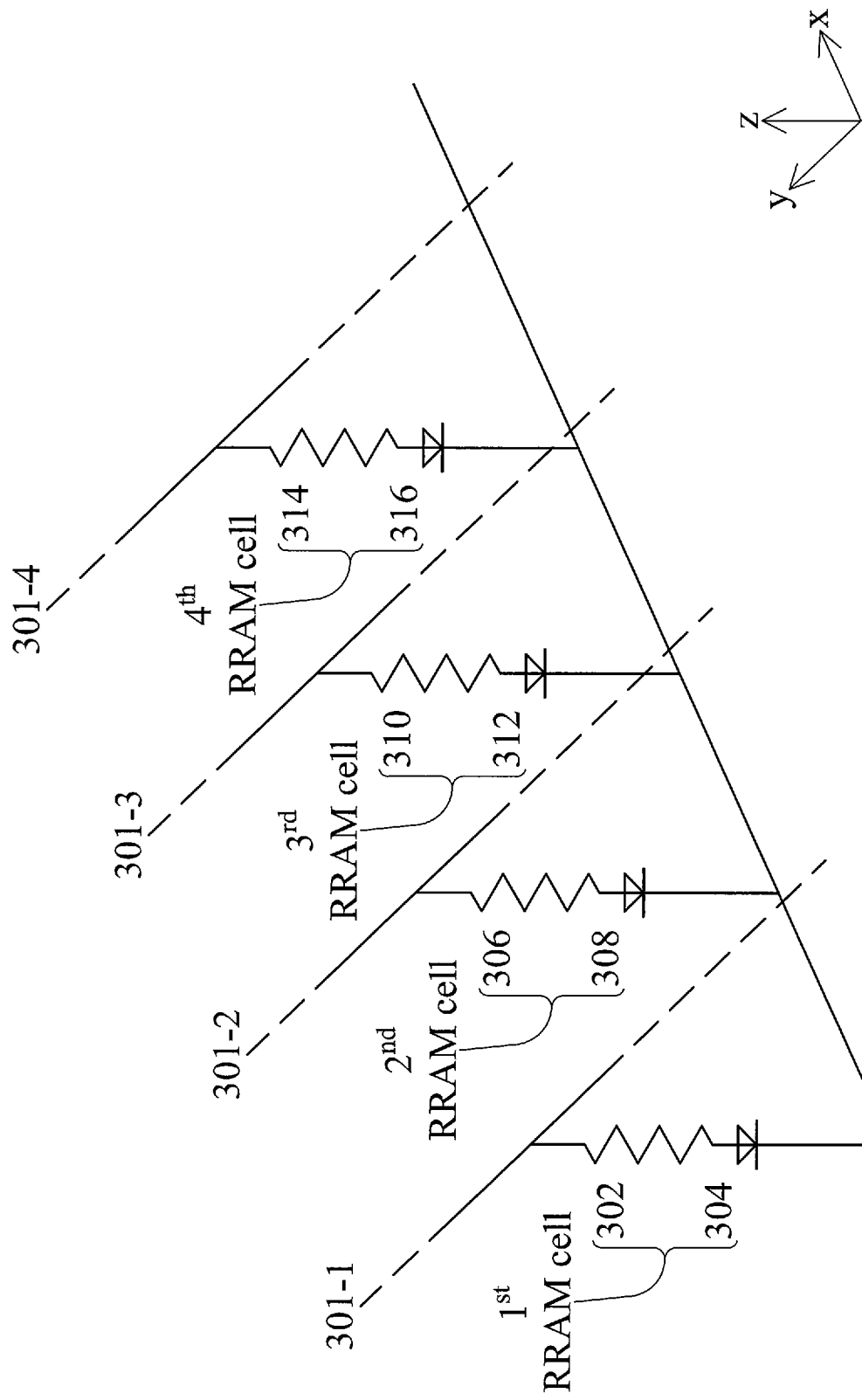
FIG. 3 illustrated a schematic diagram of a memory device that includes memory cells made by the method of FIG. 1, in accordance with some embodiments.

Further, in some embodiments, each of the first, second, third, and fourth RRAM cells may be coupled to respective conductor lines (e.g., a bit line (BL) and a word line (WL)) to enable the above-mentioned operations. As such, in some embodiments, the first, second, third, and fourth RRAM cells may form a portion of a memory device, which is also referred to as a cross-point type memory array. FIG. 3 illustrates a schematic diagram of a portion of such a memory device, in accordance with some embodiments. In the illustrated embodiment of FIG. 3, the memory and selector portions of the first RRAM cell are respectively referred to as resistor memory 302 and selector 304; the memory and selector portions of the second RRAM cell are respectively referred to as resistor memory 306 and selector 308; the memory and selector portions of the third RRAM cell are respectively referred to as resistor memory 310 and selector 312; and the memory and selector portions of the fourth RRAM cell are respectively referred to as resistor memory 314 and selector 316.

In some embodiments, the first, second, third, and fourth RRAM cells are each coupled to a respective BL or WL, and a common WL or BL at respective ends, wherein one end is coupled to the respective resistor memory and the other end is coupled to the respective selector. For example, the first RRAM cell is coupled to BL 301-1 and common WL 303; the second RRAM cell is coupled to BL 301-2 and common WL 303; the third RRAM cell is coupled to BL 301-3 and common WL 303; and the fourth RRAM cell is coupled to BL 301-4 and common WL 303. In some embodiments, the respective layers of the RRAM cells may be formed along a first direction (e.g., the Z direction), the BL's 301-1 to 301-4 may be formed along a second direction (e.g., the Y direction), and the WL 303 may be formed along a third direction (e.g., the X direction).

In an embodiment, a memory device includes: a dielectric fin formed over a substrate; and a pair of memory cells disposed along respective sidewalls of the dielectric fin, each of the pair of memory cells comprising: a first conductor layer; a selector layer; a resistive material layer; and a second conductor layer, wherein the first conductor layer, selector layer, resistive material layer, and second conductor layer each includes upper and lower boundaries, and at least one of the upper and lower boundaries is tilted away from one of the sidewalls of the dielectric fin by an angle.

In another embodiment, a memory cell includes: a plurality of dielectric fins formed over a substrate; and a plurality of memory cells disposed along respective sidewalls of the plurality of dielectric fins, each memory cells comprising: a first conductor layer; a selector layer; a resistive material layer; and a second conductor layer, wherein the first conductor layer, selector layer, resistive material layer, and second conductor layer each includes upper and lower boundaries, and at least one of the upper and lower boundaries is tilted away from a respective sidewall of one of the plurality of dielectric fins by an angle.

In yet another embodiment, a method includes: forming a dielectric fin over a substrate; depositing a first conductor material over the dielectric fin and the substrate; etching the first conductor material thereby forming a lower conductor layer that has its upper boundary tilted away from a sidewall of the dielectric fin by a first angle; depositing a selector material over the dielectric fin and the substrate; etching the selector material thereby forming a selector layer that has its lower and upper boundaries both tilted away from a sidewall of the dielectric fin by a second angle; depositing a second conductor material over the dielectric fin and the substrate; etching the second conductor material thereby forming an intermediate conductor layer that has its lower and upper boundaries both tilted away from a sidewall of the dielectric fin by a third angle; depositing a resistive material over the dielectric fin and the substrate; etching the resistive material thereby forming a resistive material layer that has its upper and lower boundaries both tilted away from the sidewall of the dielectric fin by a fourth angle; depositing a third conductor material over the dielectric fin and the substrate; and etching the third conductor material thereby forming an upper conductor material layer that has its upper and lower boundaries both tilted away from the sidewall of the dielectric fin by a fifth angle.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a dielectric fin formed over a substrate;
   a memory cell disposed along and directly contacting a flat surface of a first sidewall of the dielectric fin, the memory cell comprising: a first conductor layer, a selector layer, a resistive material layer, and a second-conductor layer, wherein each of the first conductor layer, the selector layer, the resistive material layer, and the second conductor layer directly contact the first sidewall, wherein lower and upper boundaries of the selector layer are each tilted away from the flat surface by an angle, wherein the angle is less than 90 degrees; and
   a capping layer disposed along and directly contacting each of the first conductor layer, the selector layer, the resistive material layer, and the second conductor layer such that the memory cell is disposed directly between the capping layer and the dielectric fin.

2. The memory device of claim 1, wherein the resistive material layer presents a variable resistance value.

3. The memory device of claim 1, wherein a second sidewall of the selector layer has a height of about 25 nm.

4. The memory device of claim 1, wherein the memory cell further comprises:
a third conductor layer, disposed between the first and second conductor layers, the third conductor layer directly contacting the first sidewall of the dielectric fin.

5. The memory device of claim 4, wherein the selector layer is disposed between the first and third conductor layers and the resistive material layer is disposed between the third and second conductor layers.

6. The memory device of claim 5, wherein a lower boundary of the first conductor layer is in contact with a top boundary of the substrate.

7. The memory device of claim 6, wherein an upper boundary of the first conductor layer, lower and upper boundaries of the third conductor layer, lower and upper boundaries of the resistive material layer, and a lower boundary of the second conductor layer are each tilted away from the first sidewall of the dielectric fin by the angle.

8. A memory device, comprising:
a plurality of dielectric fins formed over a substrate; and
a plurality of memory cells disposed along respective sidewalls of the plurality of dielectric fins, each memory cells comprising: a first conductor layer, a selector layer; a resistive material layer, and a second conductor layer, wherein each of the first conductor layer, the selector layer, the resistive material layer and the second conductor layer of each memory cell directly contacts a respective flat surface of a respective sidewall of a respective dielectric fin, wherein lower and upper boundaries of the selector layer are each tilted away from the respective flat surface by an angle, wherein the angle is less than 90 degrees; and
a capping layer disposed along and directly contacting each of the first conductor layer, the selector layer, the resistive material layer, and the second conductor layer such that the at least one memory cell is disposed directly between the capping layer and a respective dielectric fin of the plurality of dielectric fins.

9. The memory device of claim 8, wherein the resistive material layer presents a variable resistance value.

10. The memory device of claim 8, wherein a second sidewall of the selector layer has a height of about 25 nm.

11. The memory device of claim 8, wherein each memory cell further comprises:
a third conductor layer, disposed between the first and second conductor layer, that extends along the one of the sidewalls of the plurality of dielectric fins.

12. The memory device of claim 11, wherein the selector layer is disposed between the first and third conductor layers and the resistive material layer is disposed between the third and second conductor layers.

13. The memory device of claim 12, wherein the lower boundary of the first conductor layer is in contact with a top boundary of the substrate.

14. The memory device of claim 13, wherein an upper boundary of the first conductor layer, lower and upper boundaries of the third conductor layer, lower and upper boundaries of the resistive material layer, and a lower boundary of the second conductor layer are each tilted away from the respective sidewall of the respective dielectric fin by the angle.

15. The memory device of claim 8, wherein the first conductor layer, selector layer, resistive material layer, and second conductor layer each includes first and second sidewalls, and wherein the respective first sidewalls are in contact with the respective sidewall of one of the plurality of dielectric fins and the respective second sidewalls are aligned to be in parallel with the respective sidewall of one of the plurality of dielectric fins.

16. A memory device, comprising:
a dielectric fin formed over a substrate, the dielectric fin having a first side surface and a second side surface opposite the first side surface;
a first memory cell disposed along and directly contacting a first flat surface of the first side surface of the dielectric fin, the first memory cell comprising: a first lower conductor layer, a first selector layer, a first resistive material layer, and a first upper conductor layer, wherein each of the first lower conductor layer, the first selector layer, the first resistive material layer, and the first upper conductor layer directly contact the first flat surface of the first side surface, wherein lower and upper boundaries of the first selector layer are each tilted away from the first flat surface by an angle, wherein the angle is less than 90 degrees; and
a second memory cell disposed along and directly contacting a second flat surface of the second side surface of the dielectric fin, the second memory cell comprising: a second lower conductor layer, a second selector layer, a second resistive material layer, and a second upper conductor layer, wherein each of the second lower conductor layer, the second selector layer, the second resistive material layer, and the second upper conductor layer directly contact the second flat surface of the second side surface; and
a capping layer disposed along and directly contacting each of the first lower conductor layer, the selector layer, the resistive material layer, and the first upper conductor layer such that the first memory cell is disposed directly between the capping layer and the dielectric fin.

17. The memory device of claim 16, wherein the first and second resistive material layers each presents a variable resistance value.

18. The memory device of claim 16, wherein the first and second lower conductor layers, the second selector layer, the first and second resistive material layers, and the first and second upper conductor layers each comprises upper and lower boundaries, and at least one of the upper and lower boundaries of each layer is tilted away from the first and second side surfaces, respectively, of the dielectric fin by the angle.

19. The memory device of claim 16, wherein:
the first memory cell further comprises a first intermediate conductor layer, disposed between the first lower and upper conductor layers, the first intermediate conductor layer directly contacting the first side surface of the dielectric fin; and
the second memory cell further comprises a second intermediate conductor layer, disposed between the second lower and upper conductor layers, the second intermediate conductor layer directly contacting the second side surface of the dielectric fin.

20. The memory device of claim 19, wherein:
- the first selector layer is disposed between the first lower and intermediate conductor layers and the first resistive material layer is disposed between the first intermediate and upper conductor layers; and
- the second selector layer is disposed between the second lower and intermediate conductor layers and the second resistive material layer is disposed between the second intermediate and upper conductor layers.

\* \* \* \* \*